(12) United States Patent
Maru

(10) Patent No.: US 7,210,076 B2
(45) Date of Patent: Apr. 24, 2007

(54) INTERLEAVING ORDER GENERATOR, INTERLEAVER, TURBO ENCODER, AND TURBO DECODER

(75) Inventor: Tsuguo Maru, Tokyo (JP)

(73) Assignee: NEC Corporation (JP)

( * ) Notice: Subject to any disclaimer, the term of this patent is extended or adjusted under 35 U.S.C. 154(b) by 162 days.

(21) Appl. No.: 10/496,110

(22) PCT Filed: Nov. 19, 2002

(86) PCT No.: PCT/JP02/12082

§ 371 (c)(1),
(2), (4) Date: Nov. 9, 2004

(87) PCT Pub. No.: WO03/044965

PCT Pub. Date: May 30, 2003

(65) Prior Publication Data
US 2005/0154954 A1 Jul. 14, 2005

(30) Foreign Application Priority Data
Nov. 19, 2001 (JP) .............................. 2001-353675

(51) Int. Cl.
*G11C 29/00* (2006.01)
(52) U.S. Cl. .................................................. 714/702
(58) Field of Classification Search ................. 714/702
See application file for complete search history.

(56) References Cited

U.S. PATENT DOCUMENTS 6,233,711 B1 * 5/2001 Murayama et al. ......... 714/786
6,347,385 B1 * 2/2002 Cui et al. .................... 714/701
6,442,728 B1 * 8/2002 Cui et al. .................... 714/786
6,553,516 B1 * 4/2003 Suda et al. .................. 714/702
6,598,202 B1 * 7/2003 Kim et al. ................... 714/786

FOREIGN PATENT DOCUMENTS

| EP | 1195910 A2 | 4/2002 |
|---|---|---|
| JP | 2002-190743 | 7/2002 |
| JP | 2002-522945 | 7/2002 |
| JP | 2002-535867 | 10/2002 |
| WO | WO-99/12265 | 3/1999 |
| WO | WO-99/25069 A1 | 5/1999 |
| WO | WO-00/08770 | 2/2000 |
| WO | WO-00/42709 A1 | 7/2000 |
| WO | WO-00/62426 A1 | 10/2000 |

OTHER PUBLICATIONS

Korean Office Action issued Jan. 25, 2006 (w/ English translation of relevant portion).

(Continued)

*Primary Examiner*—Shelly Chase
(74) *Attorney, Agent, or Firm*—Dickstein, Shapiro, LLP.

(57) ABSTRACT

An interleaving order generator for a turbo encoder/decoder prevents bottlenecks incurred when temporarily storing a generated interleaving pattern. An interleaving order generator, an interleaver, a turbo encoder, and a turbo decoder realizes a minimum parameter transfer to reduce bottlenecks in the interface, even when the data rate is varied and the interleave length is frequently changed. The interleaving order generator enables a sufficient data transfer rate for providing multi-media services.

37 Claims, 12 Drawing Sheets

OTHER PUBLICATIONS

3rd Generation Partnership Project: Technical specification group ratio access network: multiplexing and channel coding (FDD) (Release 1999) pp. 14-17.

"3rd Generation Partnership Project; Technical Specification Group Radio Access Network; Multiplexing and channel coding (FDD); Release 1999"; 3G TS 25.212 V3.3.0 (Jun. 2000); Section 4.2.3.2.3. "Turbo code internal interleaver"; pp. 16-20.

"3rd Generation Partnership Project; Technical Specification Group Radio Access Network; Multiplexing and channel coding (FDD); Release 4"; 3GPP TS 25.212 V4.0.0 (Dec. 2000); Section 4.2.3.2.3. "Turbo code internal interleaver"; pp. 7-10.

Japanese Office Action issued Jul. 22, 2004 (w/ English translation of relevant portions).

Nortel Networks, NTT Docomo; "Prime Interleaver Complexity Analysis"; TSG-RAN WG-1, Meeting #4, Apr. 18, 1999, pp. 1-9.

NTT DoCoMo; "A Study on merge Interleaver for the Turbo codes"; TSG-RAN Working Group 1, Meeting #3, Nynashamn, Sweden, Mar. 22-26, 1999, pp. 1-6.

3G TS 25.212 V3.30 (2000-06); Technical Specification; 3rd Generation Partnership Project; Technical Specification Group Radio Access Network; Multiplexing and channel coding (FDD); Release 1999, pp. 1-62.

Shibutani, A. et al; "Complexity Reduction of Turbo Decoding"; PROC., IEEE Vehicular Technology, Conference, VTC 1999, Amsterdam, Netherlands, Sep. 19, 1999, pp. 1570-1574, XP010353321.

* cited by examiner

[REDUCTION]

INTERLEAVING ORDER GENERATOR, INTERLEAVER, TURBO ENCODER, AND TURBO DECODER

BACKGROUND ART

The present invention relates to a prime interleaver used for W-CDMA in the IMT 2000 (third-generation mobile communication system), and more particularly, to an interleaving sequence generator, an interleaver, a turbo encoder, and a turbo decoder, having a reduced memory for the interleaving sequence generator.

The wideband CDMA (W-CDMA) is standardized as one of radio access networks (RANs) in the third-generation mobile communication system (IMT 2000). An internal interleaver for turbo coding, so-called prime interleaver is standardized. This primer interleaver is disclosed in detail in "3rd Generation Partnership Project; Technical Specification Group Radio Access Network; Multiplexing and channel coding (FDD) (Release 1999) 3G TS25.212 V3.3.0 (2000-06), Section 4.2.3.2.3 "Turbo code internal interleaver" pp. 16–20".

The turbo encoder comprises a plurality of component encoders. The interleaver decorrelation the parity sequences from the component encoders. The component encoders are concatenated via the interleaver. The interleaver plays an important role in achieving good performance of turbo coding.

FIG. 15 is a diagram showing an example of the structure of a conventional turbo encoder. Referring to FIG. 15, the turbo encoder comprises a plurality of recursive systematic convolutional encoders 1502 and 1503, and an interleaver 1501. The recursive systematic convolutional encoders 1502 and 1503 comprise an adder and a unit delay element. An information bit, a parity bit 1, and a parity bit 2 are output every bit of information series that is inputted to the turbo encoder. The interleaver 1501 is inserted in front of the component encoder 1503 so as to decrease the correlation between the parity bit 1 and the parity bit 2.

FIG. 16 is a diagram showing an example of the structure of a conventional turbo decoder. The turbo decoder comprises two soft input/soft output decoder (also referred to as soft-in/soft-out decoders, hereinafter, abbreviated to SISOs) 1603 and 1604, two interleavers 1601 and 1602, and two deinterleavers 1606 and 1607 which restores the sequence to its original order. A splitter 1605 splits parity sequence 1 and 2 into the corresponding SISOs, and a detector 1608 detects that the finally-obtained soft output data is subjected to the hard decision as binary data.

FIG. 17 shows an example of the conventional interleaver for permuting based on the unit of bit data in the interleaving sequence stored (stored as an interleave pattern table) in a RAM. In data series 1701 for interleaving, the data series is permuted in the bit sequence by a RAM 1702 which stores the interleaving sequence based on the interleaving pattern table, and thus data series 1703 after interleaving is obtained.

As shown by reference numeral 1702, in the relationship between an output of the RAM 1702 and the interleaving pattern table, from the pattern table having R blocks with a length p based on a prime p, data is read in accordance with the longitudinal sequence of 0, 8, 4, 12, 2, . . . as shown by an arrow so as to obtain the data series 1703 after interleaving.

According to the standard 3G TS 25.212 V3.3.0 (2000-06) of the IMT 2000 (W-CDMA), 5075 types of interleaving patterns must be provided with the interleaving length of 1 to 40 to 5114 bits based on the unit of bit for various multi-media service. The pattern table corresponding to the entire interleaving lengths requires the numerous memory capacity and this it not realistic. The particle "3G TS25.212 V3.3.0 (2000-06) or Turbo code internal interleaver p. 16 to p. 20 in 4.2.3.2.3 section" discloses a scheme for generating the patterns by a predetermined operation in accordance with the interleaving lengths, instead of storing the entire types of patterns.

In the prime interleaver disclosed in the particle "3rd Generation Partnership Project; Technical Specification Group Radio Access Network; Multiplexing and channel coding (FDD) (Release 1999) 3G TS 25.212 V3.3.0 (2000-06) or V4.0.0 (2000-12) (Section 4.2.3.2.3 "Turbo code internal interleaver" pp. 16–20)", when the data length is p based on the prime p and the number of blocks is R, and the base sequence S(j) for intra-row sequence permutation is obtained as follows by using a characteristic p and a primitive root v on the finite field (intra-row permutation processing).

$$s(j)=[v \cdot s(j-1)] \bmod p, j=1,2, \ldots (p-2), \text{ and}$$
$$s(0)=1 \quad (1)$$

This is shown as Table. Next, R numbers of q(i) relatively prime to a number (p−1) obtained by subtracting one from the characteristic on the finite field are obtained. Finally, the sequence of rows is permuted based on the unit of row (inter-row permutation processing). The inter-row permutation is executed based on a predetermined pattern T(i). As the interlacing pattern in this case, a lattice pattern for increasing the free distance of the intra-rows is used.

In the i-th intra-row permutation, the following processing is executed.

$$U_i(j)=s([j \cdot r_i] \bmod (p-1)), j=0, 1, 2, \ldots, (p-2), \text{ and}$$
$$U_i(p-1)=0, \quad (2)$$

where, $U_i(j)$ indicates the bit position before permutation, corresponding to the output position after the j-th intra-row permutation of the i-th row before the permutation, an equation of $rT(i)=q(i)$ is established, and T(i) is the position of the i-th row before the above-defined permutation.

One example of the data length K=257 will be described. When the number of rows R in the two-dimensional matrix is 20, the number of columns p expressed by the prime p is 257/20=12.85. Consequently, the prime p that is not less than 12.85 and is the closet is 13. When the characteristic is 13, a primitive root v is 2 on the finite field.

Then, the base sequence S(j) for inter-row permutation is derived by using the primitive root v=2 based on the formula (1). If p=13 and v=2, then, $$\{s(j)\}=\{1, 2, 4, 8, 3, 6, 12, 11, 9, 5, 10, 7, 0\}$$

Finally, zero is inserted.

Next, in the above-mentioned example in the case of p=13, R=20 numbers of q(i) relatively prime to the number (p−1) obtained by subtracting one from the characteristic on the finite field are obtained. Consequently, the following result is obtained.

$$\{q(i)\}=\{1, 7, 11, 13, 17, 19, 23, 29, 31, 37, 41, 43, 47, 53, 59, 61, 67, 71, 73, 79\}$$

Finally, based on the above formula (2), the inter-row permutation processing is performed with the row as a unit based on the predetermined pattern. The permutation pattern between the rows is obtained for increasing the free distance in the case of R=20. That is, $Par1:\{T(i)\}=\{19, 9, 14, 4, 0, 2, 5, 7, 12, 18, 10, 8, 13, 17, 3, 1, 16, 6, 15, 11\}$.

Further, $rT(i)=q(i)$, then, $rT(1)=q(1)=1=r19$ $rT(2)=q(2)=7=r9$ $rT(3)=q(3)=11=r14$

:

$rT(19)=q(19)=73=r15$ $rT(20)=q(20)=79=r11$

The bit position $U_i(j)$ is obtained by substituting the above values into the formula (2).

According to the above-mentioned conventional art, the bit position $U_i(j)$ is calculated by software processing such as DSP (digital signal processor) or the like. In addition, the resultant data is transferred to the large-scale RAM 1702 shown in FIG. 17 for the interleaving processing.

Meanwhile, in the turbo decoder, the iterated decoding is performed. For example, in the case of decoding the received data of 2 Mbps with 8 iterations, the access to the above-mentioned interleaving sequence requires the fast operation, e.g., tens MHz. In order to respond to the requirement, the pattern generated in accordance with the above calculations is temporarily stored in a fast memory, and the memory structure needs the access having tens MHz.

However, the capacity of the memory (RAM) requires 66,482 bits (=5,114×13 bits), and greatly shares the turbo decoder. Further, it is necessary to transfer the data to the RAM for interleaving in the turbo decoder which actually performs the processing of the patterns generated based on the above calculations and the interface further needs the transfer of another data. Thus, there is a bottleneck on the interface.

Further, when the variable-rate function is provided, the interleaving length is frequently changed. In this case, the bottle neck on the interface further becomes serious and there is a problem that the rate does not follow the transfer rate in the multi-media service.

As mentioned above, the internal interleaver in the turbo decoder used for the mobile communication system corresponding to various multi-media services needs various interleaving lengths. Therefore, various interleaving patterns are necessary and a numerous memory capacity is required. Further, the fast data needs to temporarily store the interleaving pattern in a fast memory and, then, the fast memory capacity is necessary. This increases the circuit scale. Further, the service having a variable-rate function has the interface congestion due to the parameter transfer.

DISCLOSURE OF INVENTION

In consideration of the above-mentioned problems, and it is one object of the present invention to provide an interleaving sequence generator, an interleaver, a turbo encoder, and a turbo decoder, in which various interleaving-lengths and the transfer rates thereof in the multi-media service are realized with the small RAM-capacity for interleaver. Further, it is another object of the present invention to provide means, by which the load for interface is suppressed and which enables the operation for following the transfer rate in accordance with the multi-media service when the variable-rate function is provided.

According to the first aspect of the present invention, an interleaving sequence generator comprises means which sets R blocks with a data length p based on a prime p and generates R different integers q0, q1, q2, ..., qR–1 relatively prime to (p–1), means which calculates the element on the finite field when a characteristic is the prime p by raising a primitive root v to the powers of $q_0$, $q_1$, $q_2$, ..., $q_{R-1}$, thus to generate and store values $v\hat{\ }q_0(\bmod p)$, $v\hat{\ }q_1(\bmod p)$, $v\hat{\ }q_2(\bmod p)$, ..., $v\hat{\ }q_{R-1}(\bmod p)$, means which raises the values $v\hat{\ }q_0$, $v\hat{\ }q_1$, $v\hat{\ }q_2$, ..., $v\hat{\ }q_{R-1}(\bmod p)$ to the power of j on the finite field, thus to generate values $(v\hat{\ }q_0)\hat{\ }j(\bmod p)$, $(v\hat{\ }q_1)\hat{\ }j(\bmod p)$, $(v\hat{\ }q_2)\hat{\ }j(\bmod p)$, ..., $(v\hat{\ }q_{R-1})\hat{\ }j(\bmod p)$, means which generates or records a block permutation pattern that is predetermined for permuting the blocks, and means iterates, when j=1 to (p–2), such an operation that one is sequentially added to a value obtained by multiplying, by p, an output from the means for generating or recording the block permutation pattern in the 0-th permutation and such an operation that the generated values $(v\hat{\ }q0)\hat{\ }j$, $(v\hat{\ }q1)\hat{\ }j$, $(v\hat{\ }q2)\hat{\ }j$, ..., $(v\hat{\ }qR-1)\hat{\ }j(\bmod p)$ are sequentially added to a value obtained by multiplying, by p, an output from the means for generating or recording the block permutation pattern in the j-th permutation.

According to the second aspect of the present invention, the interleaving sequence generator further comprises: means which sequentially updates the values $(v\hat{\ }q_0)\hat{\ }j$, $(v\hat{\ }q_1)\hat{\ }j$, $(v\hat{\ }q_2)\hat{\ }j$, ..., $(v\hat{\ }q_{R-1})\hat{\ }j(\bmod p)$ by sequentially inputting the generated and stored values $v\hat{\ }q_0$, $v\hat{\ }q1$, $v\hat{\ }q2$, ..., $v\hat{\ }qR-1(\bmod p)$ to a fast finite field multiplier in the iteration when j=1 to (p–2).

According to the third aspect of the present invention, in the interleaving sequence generator the entire values $(v\hat{\ }q0)\hat{\ }j$, $(v\hat{\ }q1)\hat{\ }j$, $(v\hat{\ }q2)\hat{\ }j$, ..., $(v\hat{\ }qR-1)\hat{\ }j(\bmod p)$ are set to zero when j=p–1.

According to the fourth aspect of the present invention, an interleaving sequence generator comprises means which sets R blocks with a data length (p–1) based on a prime p and generates R different integers q0, q1, q2, ..., qR–1 relatively prime to (p–1). In the interleaving sequence generator, the element on the finite field is calculated when a characteristic is the prime p by raising a primitive root v to the powers of $_0$, $q_1$, $q_2$, ..., $q_{R-1}$, thus to generate and store values $v\hat{\ }q_0(\bmod p)$, $v\hat{\ }q_1(\bmod p)$, $v\hat{\ }q_2(\bmod p)$, ..., $v\hat{\ }q_{R-1}(\bmod p)$ and the values $v\hat{\ }q_0$, $v\hat{\ }q_1$, $v\hat{\ }q_2$, ..., $v\hat{\ }q_{R-1}(\bmod p)$ are raised to the power of j on the finite field, thus to generate values $(v\hat{\ }q_0)\hat{\ }j(\bmod p)$, $(v\hat{\ }q_1)\hat{\ }j(\bmod p)$, $(v\hat{\ }q_2)\hat{\ }j(\bmod p)$, ..., $(v\hat{\ }q_{R-1})\hat{\ }j(\bmod p)$, a block permutation pattern that is predetermined for permuting the blocks is generated or recorded, and, when j=1 to (p–2), the iteration is performed by such an operation that one is sequentially added to a value obtained by multiplying, by p–1, an output from the means for generating or recording the block permutation pattern in the 0-th permutation and such an operation that the generated values $(v\hat{\ }q_0)\hat{\ }j$, $(v\hat{\ }q_1)\hat{\ }j$, $(v\hat{\ }q_2)\hat{\ }j$, ..., $(v\hat{\ }q_{R-1})\hat{\ }j(\bmod p)$ are sequentially added to a value obtained by multiplying, by p–1, an output from the means for generating or recording the block permutation pattern in the j-th permutation.

According to the fifth aspect of the present invention, in the interleaving sequence generator, one is subtracted from the value that is obtained by sequential addition.

According to the sixth aspect of the present invention, the interleaving sequence generator further comprises means for generating and storing the value $(v\hat{\ }q_0)\hat{\ }j$, $(v\hat{\ }q_1)\hat{\ }j$, $(v^{\wedge}q_2)^{\wedge}j, \ldots, (v^{\wedge}q_{R-1})^{\wedge}j \pmod{p}$ in the iteration when j=1 to (p−2). In the interleaving sequence generator, the generated and stored values $(v^{\wedge}q_0)^{\wedge}j$, $(v^{\wedge}q_1)^{\wedge}j$, $(v^{\wedge}q_2)^{\wedge}j$, ..., $(v^{\wedge}q_{R-1})^{\wedge}j \pmod{p}$ are sequentially updated by sequentially inputting, to a fast finite field multiplier, the values $(v^{\wedge}q_0)^{\wedge}j$, $(v^{\wedge}q_1)^{\wedge}j$, $(v^{\wedge}q_2)^{\wedge}j$, ..., $(v^{\wedge}q_{R-1})^{\wedge}j \pmod{p}$.

According to the seventh aspect of the present invention, an interleaving sequence generator comprises means which sets R blocks with a data length (p+1) based on a prime p and generates R integers $q_0, q_1, q_2, \ldots, q_{R-1}$, relatively prime to p−1, and means which calculates elements on the finite field with the characteristic of prime p by raising a primitive root v to the powers of $q_0, q_1, q_2, \ldots, q_{R-1}$, thus to generate and store values $v^{\wedge}q_0, v^{\wedge}q_1, v^{\wedge}q_2, \ldots, v^{\wedge}q_{R-1} \pmod{p}$. In the interleaving sequence generator, the values $v^{\wedge}q_0, v^{\wedge}q_1, v^{\wedge}q_2, \ldots, v^{\wedge}q_{R-1} \pmod{p}$ are raised to the power of j on the finite field, thus to generate values $(v^{\wedge}q_0)^{\wedge}j$, $(v^{\wedge}q_1)^{\wedge}j$, $(v^{\wedge}q_2)^{\wedge}j, \ldots, (v^{\wedge}q_{R-1})^{\wedge}j \pmod{p}$, a block permutation pattern that is predetermined for permuting the blocks is generated or recorded, and the iteration is performed when j=1 to (p−2) by such an operation that one is sequentially added to a value obtained by multiplying, by p+1, an output from the means for generating or recording the block permutation pattern in the 0-th permutation and such an operation that the generated values $(v^{\wedge}q_0)^{\wedge}j$, $(v^{\wedge}q_1)^{\wedge}j$, $(v^{\wedge}q_0)^{\wedge}j, \ldots, (v^{\wedge}q_{R-1})^{\wedge}j \pmod{p}$ are sequentially added to a value obtained by multiplying, by p, an output from the means for generating or recording the block permutation pattern in the j-th permutation.

According to the eighth aspect of the present invention, the interleaving sequence generator further comprises means which generates and stores the values $(v^{\wedge}q_0)^{\wedge}j$, $(v^{\wedge}q_1)^{\wedge}j$, $(v^{\wedge}q_2)^{\wedge}j, \ldots, (v^{\wedge}q_{R-1})^{\wedge}j \pmod{p}$ in the iteration when j=1 to (p−2). In the interleaving sequence generator, the stored values are sequentially inputted to a fast finite field multiplier, thus to sequentially update the values $(v^{\wedge}q_0)^{\wedge}j$, $(v^{\wedge}q_1)^{\wedge}j$, $(v^{\wedge}q_2)^{\wedge}j, \ldots, (v^{\wedge}q_{R-1})^{\wedge}j \pmod{p}$.

According to the ninth aspect of the present invention, in the interleaving sequence generator, the entire values $(v^{\wedge}q_0)^{\wedge}j$, $(v^{\wedge}q_1)^{\wedge}j$, $(vq_2)^{\wedge}j, \ldots, (v^{\wedge}q_{R-1})^{\wedge}j \pmod{p}$ are set to 0 when j=p−1.

According to the tenth aspect of the present invention, in the interleaving sequence generator, the entire values $(v^{\wedge}q_0)^{\wedge}j$, $(v^{\wedge}q_1)^{\wedge}j$, $(vq_2)^{\wedge}j, \ldots, (v^{\wedge}q_{R-1})^{\wedge}j \pmod{p}$ are set to p when j=p.

According to the eleventh aspect of the present invention, in the interleaving sequence generator, when an output signal of the interleaving sequence generator is over an interleaver target range, the signal is skipped a next signal within the range is used.

According to the twelfth aspect of the present invention, a plurality of fast multipliers on the finite field are provided, a plurality of values $(v^{\wedge}q_0)^{\wedge}j$, $(v^{\wedge}q_1)^{\wedge}j$, $(vq_2)^{\wedge}j, \ldots, (v^{\wedge}q_{R-1})^{\wedge}j \pmod{p}$ are simultaneously updated by sharing with the plurality of fast multipliers on the finite field upon updating of the value $(v^{\wedge}q_0)^{\wedge}j$, $(v^{\wedge}q_1)^{\wedge}j$, $(v^{\wedge}q_2)^{\wedge}j, \ldots, (v^{\wedge}q_{R-1})^{\wedge}j \pmod{p}$ and, when an output of the interleaving sequence generator is over an interleaver target range, the signal is skipped a next signal within the range is used to continuously generate the signal.

According to the thirteenth aspect of the present invention, in the interleaving sequence generator, two fast multipliers on the finite field are provided, the two fast multipliers are assigned to values $v^{\wedge}q_0, v^{\wedge}q_2, v^{\wedge}q_4, \ldots, v^{\wedge}q2n \pmod{p}$ (n is a natural number) as an even number and values $v^{\wedge}q_1, v^{\wedge}q_3, v^{\wedge}q_5, \ldots, v^{\wedge}q2n-1 \pmod{p}$ as an odd number that are obtained by splitting the generated and stored values $v^{\wedge}q_0, v^{\wedge}q_1, v^{\wedge}q_2, \ldots, v^{\wedge}q_{R-1} \pmod{p}$, and simultaneously updates in parallel the values $(v^{\wedge}q_0)^{\wedge}j$, $(v^{\wedge}q_2)^{\wedge}j, \ldots, v^{\wedge}q2n \pmod{p}$ and $(v^{\wedge}q_1)^{\wedge}j$, $(v^{\wedge}q_3)^{\wedge}j, \ldots, v^{\wedge}q2n-1 \pmod{p}$ by the j-th power on the finite field.

According to the fourteenth aspect of the present invention, in the interleaver, data are read from a memory by an output of the interleaving sequence generating circuit referred to as an address signal indicating the address of the memory in which the data is stored, thus to permute the data sequence.

According to the fifteenth aspect of the present invention, in the interleaver, data are written in a memory by an output of the interleaving sequence generating circuit referred to as an address signal indicating the address of the memory in which the data is to be stored, thus to permute the data sequence.

According to the sixteenth aspect of the present invention, in a turbo encoder, the interleaver is an internal interleaver in the turbo encoder.

According to the seventeenth aspect of the present invention, in a turbo decoder, one of the interleavers (fourteenth aspect & fifteenth aspect) is an internal interleaver in the turbo decoder and the other is an internal deinterleavers.

According to the eighteenth aspect of the present invention, in a turbo decoder, an output of an interleaving sequence generator is used as an address signal for reading a dual-port memory for storing data, and the address signal subjected to the delay operation with a predetermined value is used as an address signal for writing, thus simultaneously realizing an internal interleaver and an internal deinterleavers in the turbo decoder.

According to the nineteenth aspect of the present invention, in an interleaving sequence generating circuit for providing R blocks with a data length p based on a prime p, and obtaining an output position $U_i(j)$ after j-th intra-row permutation of an i-th row before row permutation, by using a primitive root v on the finite field with a characteristic p, R table are generated, thus to obtain the $U_i(j)$.

According to the present invention, in the mobile communication system corresponding to various multi-media services, the interleaver using the prime number used for the turbo decoder can respond to various interleaving lengths without the increase in circuit scale. Further, in the interleaving sequence generator, interleaver, turbo encoder, and turbo decoder, a small RAM-capacity for interleaver is realized and the load for the interface is reduced. Thus, even in the multi-media services having a variable-rate function, the transfer rate is easily followed.

BEST MODE FOR CARRYING OUT THE INVENTION

Next, embodiments of the present invention will be described with reference to the drawings.

Figure 13:
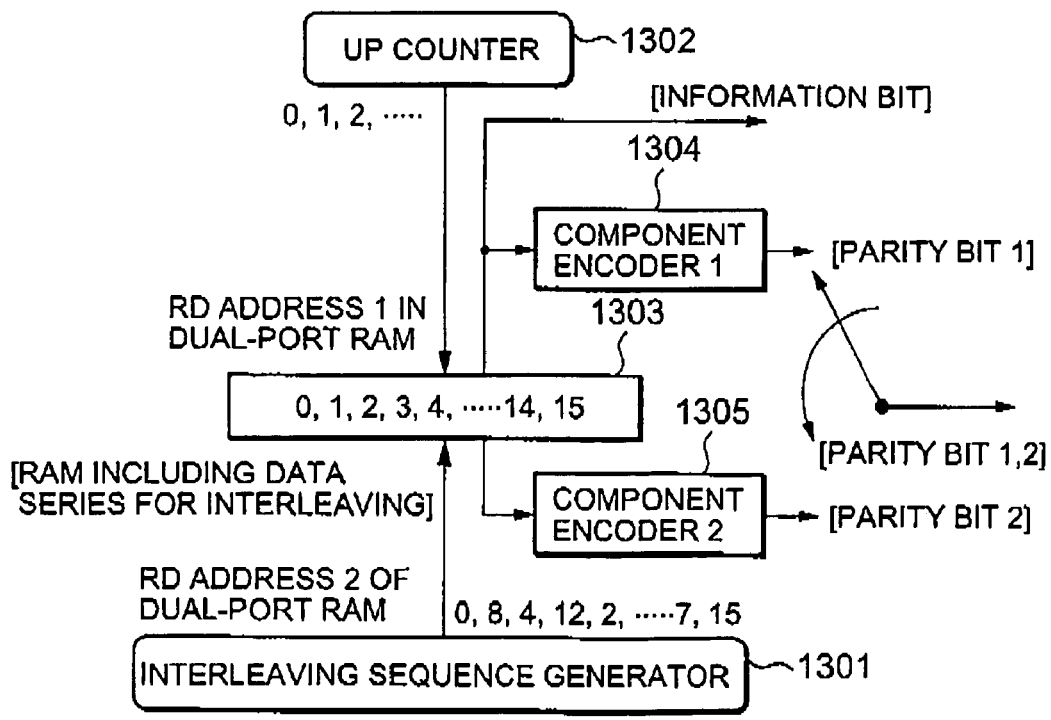
FIG. 13 is a diagram showing a turbo encoder using an interleaving sequence generator according to the present invention.

FIG. 13 is a block diagram showing a turbo encoder using an interleaving sequence generator according to the present invention. Although the operation of the turbo encoder shown in FIG. 13 will be described later, mainly, the turbo encoder shown in FIG. 13 is different from a conventional turbo encoder shown in FIG. 15 in an interleaver 1501.

Figure 17:
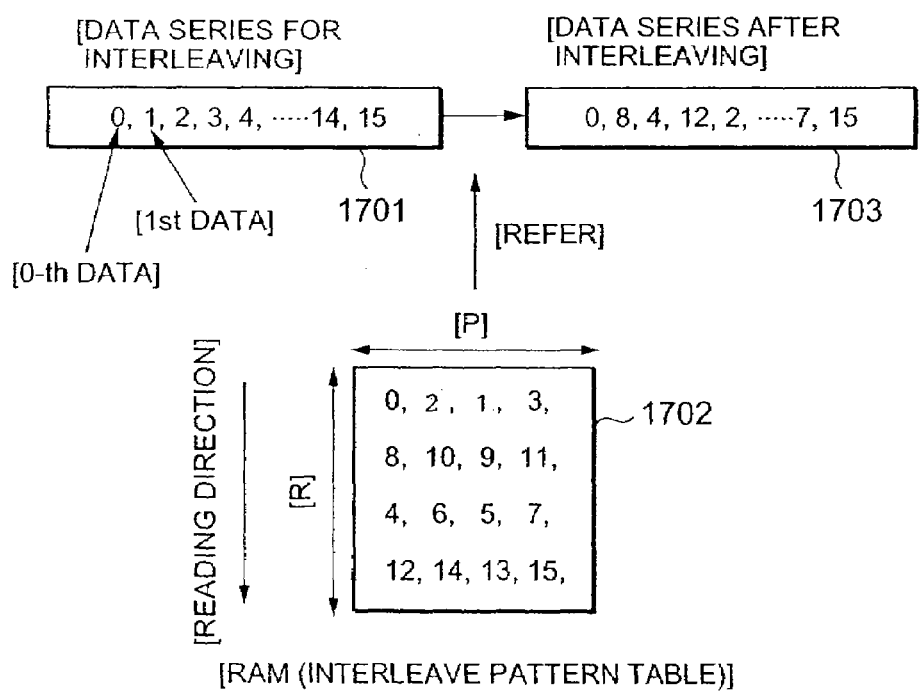
FIG. 17 is a diagram showing an example of the structure of the conventional turbo decoder for permutation based on the unit of bit in accordance with the interleaving sequence stored in a RAM.

Referring to FIG. 17, the conventional interleaver needs a large-scale RAM 1702 which stores the interleaving sequence. On the contrary, according to the embodiment, referring to FIG. 13, an interleaving sequence generator 1301 is used to realize a prime interleaver without the large-scale RAM that stores the interleaving sequence.

An interleaving method according to the present invention is basically similar to the above-mentioned prime interleaver. However, according to the present invention, a position $U_i(j)$ is generated in the real time and the interleaving processing is performed without conventionally pre-calculating the position $U_i(j)$ and transferring it to the RAM or the like. Thus, the large-scale RAM which is conventionally necessary is not required. Hereinbelow, its method will be described.

First, the following equation is obtained by the formula (1).

$$s(0)=1$$

$$s(1)=v \bmod p$$

$$s(2)=v^2 \bmod p$$

$$\vdots$$

$$s(j)=v^j \bmod p$$

Incidentally, a relation of $(v^j) \equiv v^j$ is obtained. In the above formula, reference symbol v denotes a primitive root and thus the entire elements on the finite field plane (mod p) are spanned by iterate v multiplying processing on mod p.

This result is applied to the formula (2) and then the following is obtained.

$$U_i(j)=s\{[j \cdot r_i] \bmod(p-1)\}=[v^\{([j \cdot r_i] \bmod(p-1))\}] \bmod p$$

Here, in place of $[j \cdot r_i] \bmod(p-1)=j \cdot r_i - n \cdot (p-1)$, the following is obtained.

$$U_i(j)=[v^\{j \cdot r_i - n \cdot (p-1)\}] \bmod p = (v^{r_i})^j \cdot (v^{(p-1)})^{(-n)} \bmod p = \{(v^{r_i})^j \bmod p\} \cdot \{(v^{(p-1)})^{(-n)} \bmod p\} \bmod p$$

Incidentally, based on the Fermat_s Theorem, the following relation is obtained for the whole elements a.

$$a^{(p-1)} \equiv 1 \pmod{p}, \text{ where } p: \text{prime}$$

Consequently, the following is obtained.

$$(v^{(p-1)})^{(-n)} \bmod p = 1$$

Hence, the foregoing formula is as follows.

$$U_i(j)=(v^{r_i})^j \bmod p \quad (3)$$

Based on the above description, rT(i)=qi and the following is obtained between the permutation patterns between the rows in the case of R=20.

Pat1:{T(0), T(1), . . . , T(R−1)}={19, 9, 14, 4, 0, 2, 5, 7, 12, 18, 10, 8, 13, 17, 3, 1, 16, 6, 15, 11}

In this case, the row position T(0) at the 0-th row (j=0) is 19 and $q_0$ (=r19) is selected as a value of the row. Similarly, in the case of the first row (i=1), the row position T(1) is 9 and $q_1$ (=r9) is selected as a value of the row.

As mentioned above, the row position $r_i$ is set to different values. Consequently, the relation $(v^{r_i})$ in the formula (3) have varied values depending on the rows. The intra-row sequence every row is varied depending on the rows and becomes random. The value $q_i$ given by the equation rT(i)= $q_i$ is selected by the relation relatively prime to (p−1). The symbol v is the primitive root so the order of a is (p−1).

Reference symbol a denotes an arbitrary element in the set defined by mod p. Then, the value p−1 is maximum order in mod p and, hence, the following relation is established.

$$a^{(n \cdot (p-1))} = (\bmod p)$$

Therefore, the condition that the formula (3) is $(v^{r_i})^j=1$ (mod p) requires $r_i \cdot j = n \cdot (p-1)$ and $(p-1) | r_i \cdot j$.

On the other hand, the value $r_i$ is relatively prime to (p−1) and the value $r_i$ does not include any factor of (p−1), and this indicates (p−1)|j, namely, the order of $(v^{r_i})$ is (p−1) which means the value $(v^{r_i})$ is also primitive root under the condition of (mod p).

Therefore, the following relation is obtained.

$$U_i(j)=(v^{r_i})^j \bmod p, \text{ where } j=0, 1, 2, \ldots, (p-2)$$

The above relation forms a random-sequence generating algorithm using the congruential method as one of the linear congruential methods having a multiplier of a different primitive root $(v\hat{}r_i)$ every row. The $(v\hat{}r_i)$ is the primitive root on the prime field and therefore a value $(v\hat{}r_i)\hat{}j$ which is expressed by the power spans the whole element of the prime field and it keeps the one-to-one mapping relationship which needs interleaver design.

This indicates the acquisition of the value $U_i(j)$ without the table generated by the formula (1) of $\{s(j)=[v \cdot s(j-1)] \mod p, j=1, 2, \ldots (p-2),$ and $s(0)=1\}$ by recursively multiplying the value $(v\hat{}r_i)$ as a multiplier in the formula (3).

In the case of the data length k=5114 bits, the number of columns p expressed by the prime number is 5114/20 (=255.7) for 20 as the number of rows in the two-dimensional matrix and the closest prime number p is 257 as the number of columns. As a comparison using the number, the number of tables generated by $\{s(j)=[v \cdot s(j-1)] \mod p, j=1, 2, \ldots, (p-2),$ and $s(0)=1\}$ must be 257. On the contrary, the number of tables is $(v\hat{}r_i) \mod p, (i=0, \ldots, 19)$, namely, 20. The memory capacity is reduced to 1/10 or less.

As will be understood by the foregoing, according to the present invention, it is more advantageous as the data length is longer in the case of the same number of rows. The turbo coding has an interleaver gain as a feature and the higher codin-gain is obtained as the data length is longer. That is, the present invention is preferable to the turbo coding. Although the short data-length is described because of a brief description according to the following embodiment, the data length may have an arbitrary one.

Figure 1:
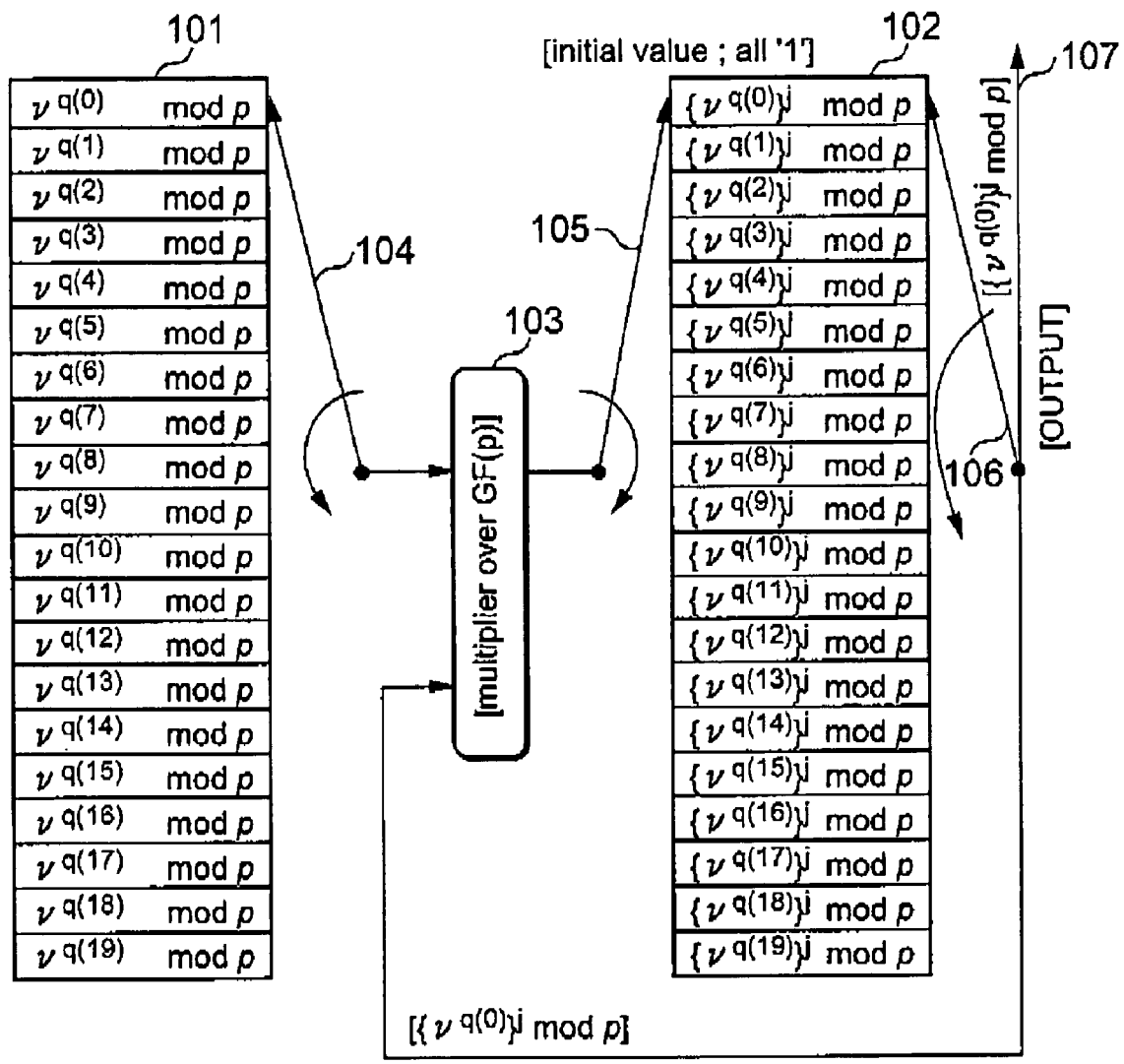
FIG. 1 is a diagram showing a generating block of $\{(v^{\wedge}q_0)^{\wedge}j \pmod{p} \text{ to } (v^{\wedge}q_{R-1})^{\wedge}j \pmod{p}\}$ in an interleaving sequence generator according to the present invention.

FIG. 1 is a block diagram showing a $(v\hat{}q_0)\hat{}j \pmod p$ to $(v\hat{}q_{R-1})\hat{}j \pmod p$ generating portion for generating the value $U_i(j)$ in the above formula (3) in the interleaving sequence generator according to the first embodiment of the present invention. According to the first embodiment, the data length K is 257 and the two-dimensional matrix is expressed by the prime p=13 and the number of rows R=20.

At the 0-th row after $(v\hat{}r_i)$ permutation used for the foregoing, an equation of $(v\hat{}r_{19})=(v\hat{}q_0)$ is established. At the first row after the permutation, an equation of $(v\hat{}r_9)=(v\hat{}q_1)$ is obtained. That is, at the row (i) (=0 to 19), an equation of $(v\hat{}rT(i))=(v\hat{}q_i)$ is obtained. This indicates that the multiple for the row number i after the permutation may be $(v\hat{}q_i)$.

Here, it is necessary to pay attention to the intra-row relation and the row position before row permutation must be added. In this case, the row is permuted from T(i) to i and therefore, if the number of columns p=13, then, p×T(i) must be added.

Referring to FIG. 1, a fast multiplier 103 on the finite field is connected to a register 101 which stores a multiple $v\hat{}q_0$, $v\hat{}q_1, v\hat{}q_2, \ldots, v\hat{}q_{R-1} \pmod p$ via a selector 104. The multiplier outputs are connected to a register 102 which temporarily stores multiplying results via a selector 105. An output from the register 102 is output via a selector 106 and is further connected to one input terminal of the multiplier 103.

The selectors 104, 105, and 106 are controlled for the interlocking selection and, for the row number i=0 to R-1, the selector 104 selects $v\hat{}q_0 \pmod p$ to $v\hat{}q_{R-1} \pmod p$ and the selectors 105 and 106 select $(v\hat{}q_0)\hat{}j \pmod p$ to $(v\hat{}q_{R-1})\hat{}j \pmod p$.

The selector is alternately address-controlled and the register is replaced with the RAM so as to realize the similar structure. Hereinbelow, a description is given of the operation for generating the interleaving sequence according to the present invention with reference to FIG. 1.

First, the operation for the 0-th permutation will be described. The entire initial values of the register 102 are preset to '1'. In the transition from the 0-th permutation corresponding to J=0 to the first permutation corresponding to j=1, the entire selected values of the selector 106 are '1'. This value is inputted to one input-terminal of the multiplier 103 and is output from an output terminal 107. That is, in the case of the 0-th permutation corresponding to j=0, the entire values of the output terminal 107 are '1'.

In this case, the selector 104 sequentially selects $v\hat{}q_0 \pmod p$ to $v\hat{}q_{R-1} \pmod p$. The output of the multiplier 103 is $v\hat{}q_0 \pmod p$ to $v\hat{}q_{R-1} \pmod p$ and the selector 105 interlocking thereto sequentially updates $v\hat{}q_0 \pmod p$ to $v\hat{}q_{R-1} \pmod p$ in the register 102, in place of the initial value '1'.

Next, in the first permutation corresponding to j=1, the selected value of the selector 106 is $v\hat{}q_0 \pmod p$ to $v\hat{}q_{R-1} \pmod p$. When this value is inputted to the one input-terminal of the multiplier 103, $v\hat{}q_0 \pmod p$ to $v\hat{}q_{R-1} \pmod p$ is transmitted from the output terminal 107.

Then, the selector 104 sequentially selects $v\hat{}q_0 \pmod p$ to $v\hat{}q_{R-1} \pmod p$ and the output of the multiplier 103 is $(v\hat{}q_0)\hat{}2 \pmod p$ to $(v\hat{}q_{R-1})\hat{}2 \pmod p$. The selector 105 interlocking operation thereto inputs and sequentially updates, in the register 102, $(v\hat{}q_0)\hat{}2 \pmod p$ to $(v\hat{}q_{R-1})\hat{}2 \pmod p$ in place of $v\hat{}q_0 \pmod p$ to $v\hat{}q_{R-1} \pmod p$.

The similar operation continues. Then, in the j-th permutation, the selected value of the selector 106 is $(v\hat{}q_0)\hat{}j \pmod p$ to $(v\hat{}q_{R-1})\hat{}j \pmod p$. This value is inputted to the one input terminal of the multiplier 103 and then $(v\hat{}q_0)\hat{}j \pmod p$ to $(v\hat{}q_{R-1})\hat{}j \pmod p$ are transmitted from the output terminal 107. In this case, the selector 104 sequentially selects $v\hat{}q_0 \pmod p$ to $v\hat{}q_{R-1} \pmod p$ and the output of the multiplier 103 is $(v\hat{}q_0)\hat{}(j+1) \pmod p$ to $(v\hat{}q_{R-1})\hat{}(j+1) \pmod p$. The selector 105 interlocking operating thereto inputs, to the register 102, $(v\hat{}q_0)\hat{}(j+1) \pmod p$ to $(v\hat{}q_{R-1})\hat{}(j+1) \pmod p$ which are sequentially updated in place of $(v\hat{}q_0)\hat{}j \pmod p$ to $(v\hat{}q_{R-1})\hat{}j \pmod p$.

The above-generated $(v\hat{}q_0)\hat{}j \pmod p$ to $(v\hat{}q_{R-1})\hat{}j \pmod p$ are values which are read in the column direction of the two-dimensional matrix after the intra-row permutation in the formula (3) of $U_i(j)=(v\hat{}r_i)\hat{}j \mod p$.

As mentioned above, the row position before the row permutation needs to be added. That is, when the row is permuted from T(i) to i, p×T(i) needs to be added.

Figure 2:
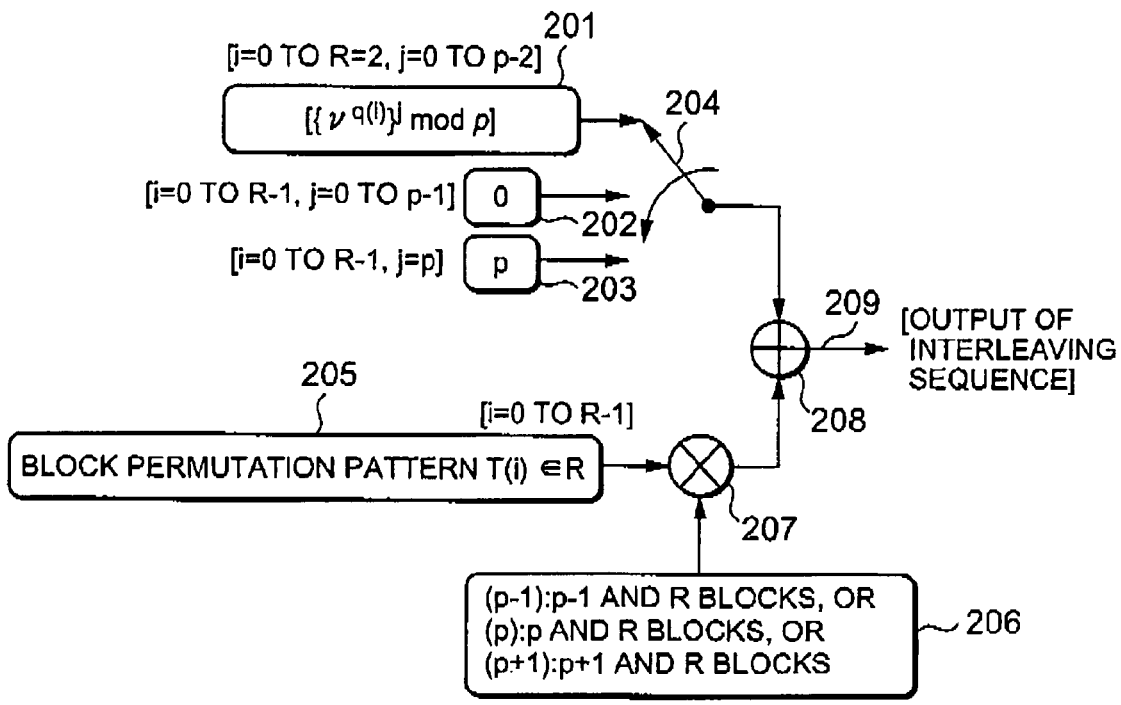
FIG. 2 is a block diagram for generating the interleaving sequence by the addition of row positions in the interleaving sequence generator according to the present invention.

FIG. 2 is a block diagram showing an interleaving sequence generator according to the first embodiment of the present invention.

Referring to FIG. 2, reference numeral 201 denotes the $(v\hat{}q_0)\hat{}j \pmod p$ to $(v\hat{}q_{R-1})\hat{}j \pmod p$ generating portion. Reference numeral 205 denotes a table which previously stores a block permutation pattern T(i) and T(i) (i=0 to R-1) is output in accordance with the row updating.

A selector 204 selects a $(v\hat{}q_0)\hat{}j \pmod p$ to $(v\hat{}q_{R-1})\hat{}j \pmod p$ generating portion 201 (where j=0 to p-2). However, finally, when j=p-1, the selector 204 selects a zero output portion 202 for outputting a zero output. For the final column, a value of p×T(i) (i=0 to R-1) is transmitted from an output terminal 209 as the interleaving sequence output.

A set value of a column number setting portion 206 for setting the number of columns in the two-dimensional matrix is p according to the first embodiment. A multiplier 207 generates p×T(i). An adder 208 adds the value of p×T(i) and the value selected by the selector 204.

The transition timing from a value of $(v\hat{}q_0)\hat{}j \pmod p$ when i=0 to a value of $(v\hat{}q_{R-1})\hat{}j \pmod p$ when i=R-1 in the $(v\hat{}q_0)\hat{}j \pmod p$ to $(v\hat{}q_{R-1})\hat{}j \pmod p$ generating portion 201 is synchronous to the transition timing for outputting the block permutation pattern T(i) (i=0 to R−1) from the table 205. Thus, the output of the adder 208 becomes a value read in the column direction of the two-dimensional matrix using $U_i(j)=(v\char`\^r_i)\char`\^j \bmod p$ after the intra-row permutation.

Next, the case of data length K=280 will be described. The row number R in the two-dimensional matrix is 20. Since 280 divided by 20 equals 14, the closest prime more than 14 should be selected. However, if the column number C=p+1 and the prime p=13, then, the two-dimensional matrix can be used. Then, the two-dimensional matrix of 14×20 is considered. If C=p+1, then, the primitive root is similarly used. The primitive root on the finite field with the characteristic of 13 is 2. A formula for intra-row permutation is shown as follows by using the primitive root v=2.

The formula for the intra-row permutation is as follows.

$$U_i(j)=(v\char`\^r_i)\char`\^j \bmod p, \text{ where } j=0, 1, 2, \ldots, (p-2)$$

The above formula is derived because of the above-mentioned reason when the column number C=p. Hereinbelow, a description will be given of the interleaving sequence generator when C=p+1 according to the present invention.

Similarly to the case of C=p, $(v\char`\^rT(i))=(v\char`\^q_i)$ (i=0 to 19) after permutation is obtained. Therefore, the multiple for the row number i after permutation may be $(v\char`\^q_i)$. Since the row is permuted from the T(i) to i, the number of columns C is p+1=13+1=14. Then, a value of (p+1)×T(i) must be added.

The processing is executed by the interleaving sequence generator shown in FIG. 2. Referring to FIG. 2, in the case of C=p+1 similarly to the case of C=p, the value $(v\char`\^q_0)\char`\^j$ (mod p) to $(v\char`\^q_{R-1})\char`\^j$ (mod p) (i=0 to p−2) generated in FIG. 1 is realized by the same processing. The selector 204 selects the $(v\char`\^q_0)\char`\^j$ (mod p) to $(v\char`\^q_{R-1})\char`\^j$ (mod p) generating portion 201 (j=0 to p−2). When j=p−1, the selector 203 selects the zero output portion 202. In this case, the multiplier 207 multiplies the block permutation pattern T(i) in the table 205 and the value of C=p+1 set by the column number setting portion 206. The multiplying result is output to an output terminal 209 via the adder 208.

Finally, when j=p, the selector 204 selects a value of p set by a p-setting portion 203. At the final column, the addition of the value of p and the value of (p+1)×T(i) where i=0 to R−1 is transmitted from the output terminal 209 as the interleaving sequence output. Here, from the table 205, the block permutation pattern T(i) where i=0 to R−1 is output in accordance with the row updating.

In this case, the column number setting portion 206 sets a column number set value in the two-dimensional matrix to p+1, the multiplier 207 generates, and the adder 208 adds the value of (p+1)×T(i) and the value selected by the selector 204.

The transition timing from a value of $(v\char`\^q_0)\char`\^j$ (mod p) when i=0 to a value of $(v\char`\^q_{R-1})\char`\^j$ (mod p) when i=R−1 in the $(v\char`\^q_0)\char`\^j$ (mod p) to $(v\char`\^q_{R-1})\char`\^j$ (mod p) generating portion 201 is synchronous to the transition timing for outputting the block permutation pattern T(i) (i=0 to R−1) from the table 205. Thus, the output of the adder 208 becomes the value read in the column direction of the two-dimensional matrix using $U_i(j)=(v\char`\^r_i)\char`\^j \bmod p$ after the intra-row permutation, similarly to the case of C=p.

Next, an example of the data length K=320 will be described. The number of rows R in the two-dimensional matrix is 20. Since 320/20=16, the column number C is the closest prime p=17. However, if the column number C=p−1=16, then, the two-dimensional matrix can be used. Then, the application of the two-dimensional matrix 16×20 is considered. In the case of C=p−1, the primitive root is similarly used. The primitive root on the finite field with the characteristic of 17 is 3.

The formula for intra-row permutation with the primitive root v=3 is as follows.

$$U_i(j)=(v\char`\^r_i)\char`\^j \bmod p, \text{ where } j=0, 1, 2, \ldots, (p-2)$$

The above formula is derived because of the above-mentioned reason in the case of the column number C=p.

Hereinbelow, a description is given of the case of applying, to the column number C=p−1, the interleaving sequence generator according to the present invention with reference to FIG. 1. Similarly to the case of C=p, an equation of $(v\char`\^rT(i))=(v\char`\^qi)$ (i=0 to 19) after permutation is obtained. Therefore, a multiple may be $(v\char`\^q_i)$ for the row number i after permutation. Since the row is permuted from the T(i) to i, the number of columns C is (p−1)=17−1=16 and then (p−1)×T(i) must be added.

The interleaving sequence generator shown in FIG. 2 performs the processing. Similarly to the case of C=p, in the case of i=0 to p−2, values of $(v\char`\^q_0)\char`\^j$ (mod p) to $(v\char`\^q_{R-1})\char`\^j$ (mod p) generated in FIG. 1 are realized through the same processing with the number of columns C=p−1. In the case of the number of columns C=p, when i=p−1, a zero output portion 202 is selected. However, in the case of the number of columns C=p−1, the row number i equals 0 to p−2. Therefore, the selector 204 still selects the $(v\char`\^q_0)\char`\^j$ (mod p) to $(v\char`\^q_{R-1})\char`\^j$ (mod p) generating portion 201 and selects neither the zero output portion 202 nor the p output portion 203. In the case of the number of columns C=p−1, the zero output portion 202 is not selected and therefore the sequence permutation pattern is 1 to C. Then, one can be subtracted for a value which is generated so that the permutation pattern matches 0 to C−1.

Figure 3:
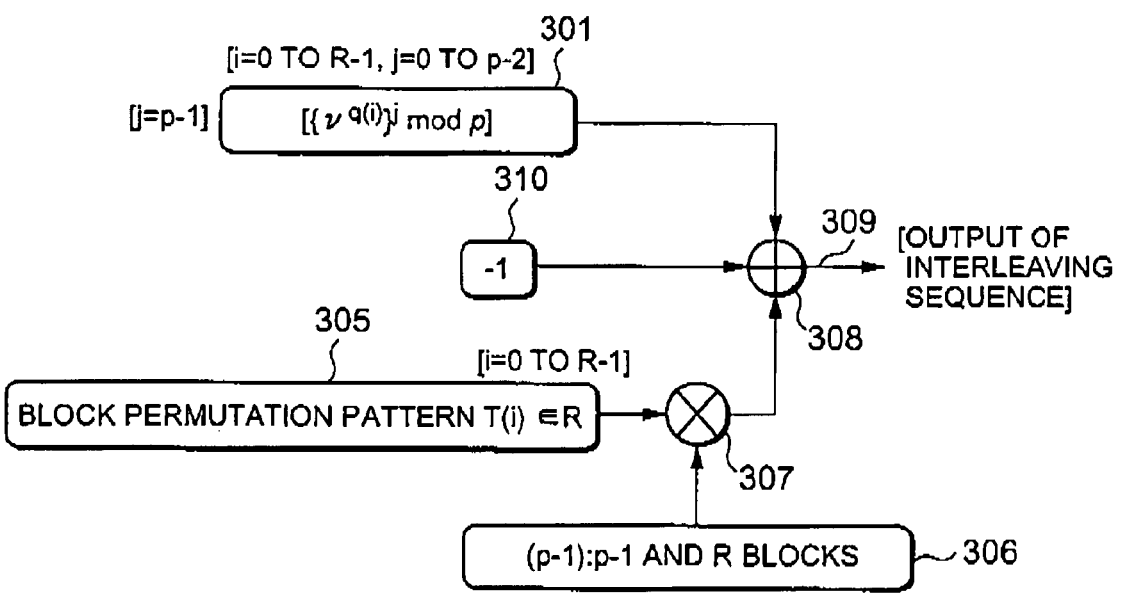
FIG. 3 is a block diagram for generating the interleaving sequence when the number of columns C is p−1 and a permutation pattern is 0 to C−1 as a subtraction result.

FIG. 3 is a block diagram showing an example of the structure of the interleaving sequence generator in the case of C=p−1. In the case of C=p−1, the operation corresponding to the selector 204 is not used.

Outputs from a $(v\char`\^q_0)\char`\^j$ (mod p) to $(v\char`\^q_{R-1})\char`\^j$ (mod p) generating block 301 are directly inputted to an adder 308. The adder 308 receives a value of (−1) from a constant generating portion 310 which outputs a value of (−1) for subtraction. A multiplier 307 multiplies the number of columns C=p−1 in the two-dimensional matrix from a column number setting portion 306 to a block permutation pattern T(i) in a table 305. This result (p−1)×T(i) is inputted to the adder 308. These adding results are transmitted from an output terminal 309 as the interleaving sequence outputs.

Figure 4:
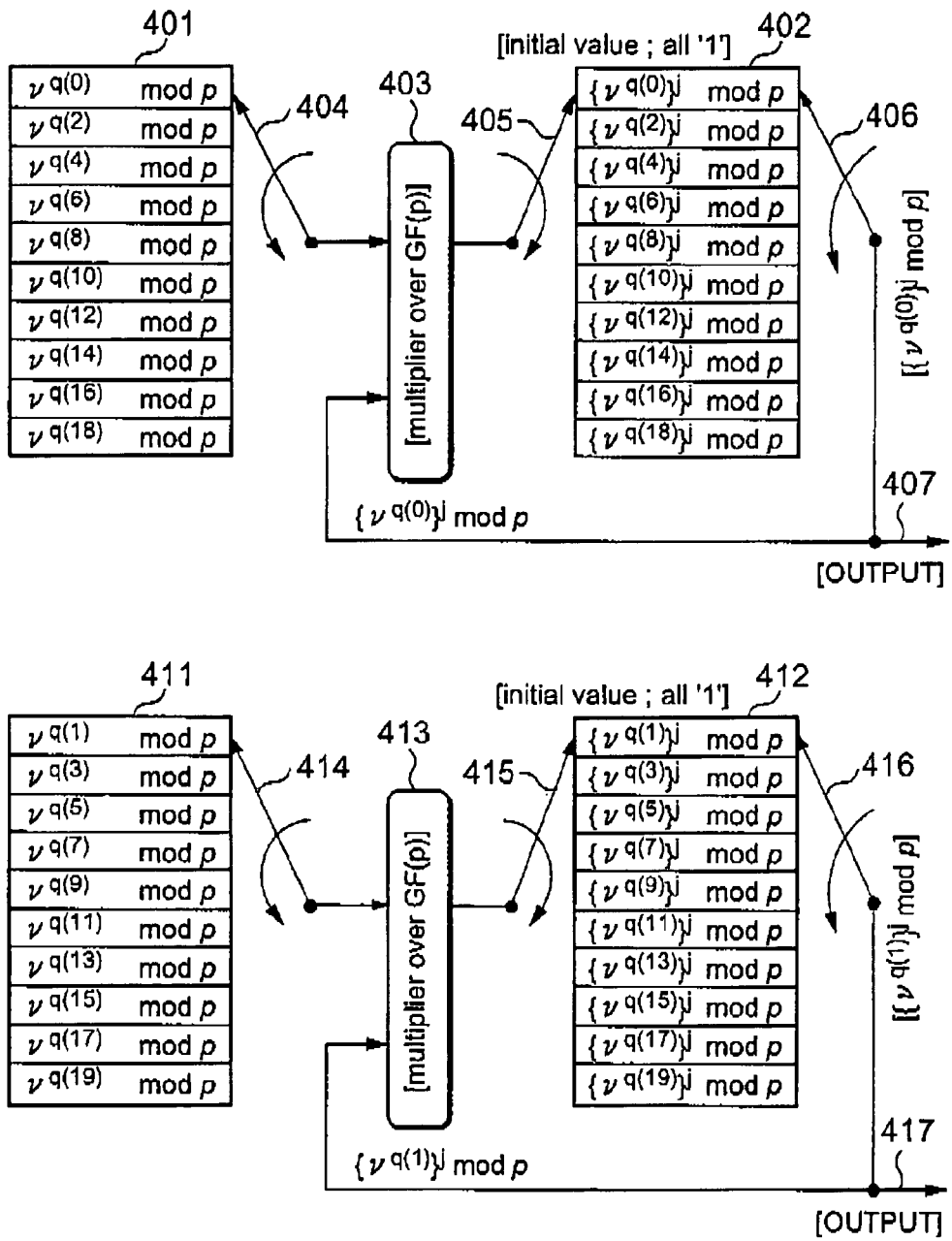
FIG. 4 is a block diagram for continuously generating $\{(v^{\wedge}q_0)^{\wedge}j \pmod{p} \text{ to } (v^{\wedge}q_{R-1})^{\wedge}j \pmod{p}\}$ even in the case of providing two fast multipliers on the finite field and of skipping a signal.

FIG. 4 is a block diagram showing a $(v\char`\^q_0)\char`\^j$ (mod p) to $(v\char`\^q_{R-1})\char`\^j$ (mod p) generating block for generating $U_i(j)$ in the above formula (3) in the interleaving sequence generator according to the second embodiment of the present invention.

When the output signal from the interleaving sequence generator is over the interleaver target range, the signal is skipped. However, according to the second embodiment, upon the signal skipping, the above-mentioned two fast multipliers on the finite field are provided so as continuously generate the signal.

Referring to FIG. 4, the register 101 for storing the multiple $v\char`\^q_0, v\char`\^q_1, v\char`\^q_2, \ldots, v\char`\^q_{R-1}$ (mod p) shown in FIG. 1 is split into two registers 401 and 411 and, however, the total capacity is the same as that shown in FIG. 1. Various splitting methods can be used. Here, a description is given of an example for splitting the register 101 into the even register 401 which stores a multiple $v\char`\^q_0(\bmod p), v\char`\^q_2(\bmod p), v\char`\^q_4(\bmod p), \ldots, v\char`\^q_{2n}(\bmod p)$ and the odd register 411 which stores a multiple $v\hat{\,}q_1(\text{mod }p)$, $v\hat{\,}q_3(\text{mod }p)$, $v\hat{\,}q_5(\text{mod }p)$, ..., $v\hat{\,}q_{2n-1}(\text{mod }p)$ (where n is a natural number).

Two fast multipliers 403 and 413 are on the finite field and obtain one multiplier-input from the registers that store the multipliers 401 and 411 via selectors 404 and 414. The multiplier outputs are connected to registers 402 and 403 which temporarily store multiplying results via selectors 405 and 415.

Outputs from the registers 402 and 412 are output to output terminals 407 and 417 via selectors 406 and 416, add are connected to one of input terminals of the multipliers 403 and 413. The selectors 404 to 406 and the selectors 414 to 416 are controlled for the interlocking selection and thus the similar calculation result described with reference to FIG. 1 can simultaneously be obtained for the even and odd numbers. That is, $(v\hat{\,}q_0)\hat{\,}j$, $(v\hat{\,}q_2)\hat{\,}j$, ..., (mod p) and $(v\hat{\,}q_1)\hat{\,}j$, $(v\hat{\,}q_3)\hat{\,}j$, ..., (mod p) are simultaneously obtained.

Alternately, the selector may be address-controlled and a dual-port RAM further may simultaneously execute the access corresponding to the even number and the access corresponding to the odd number. One RAM can execute the same operation of the two registers.

Figure 5:
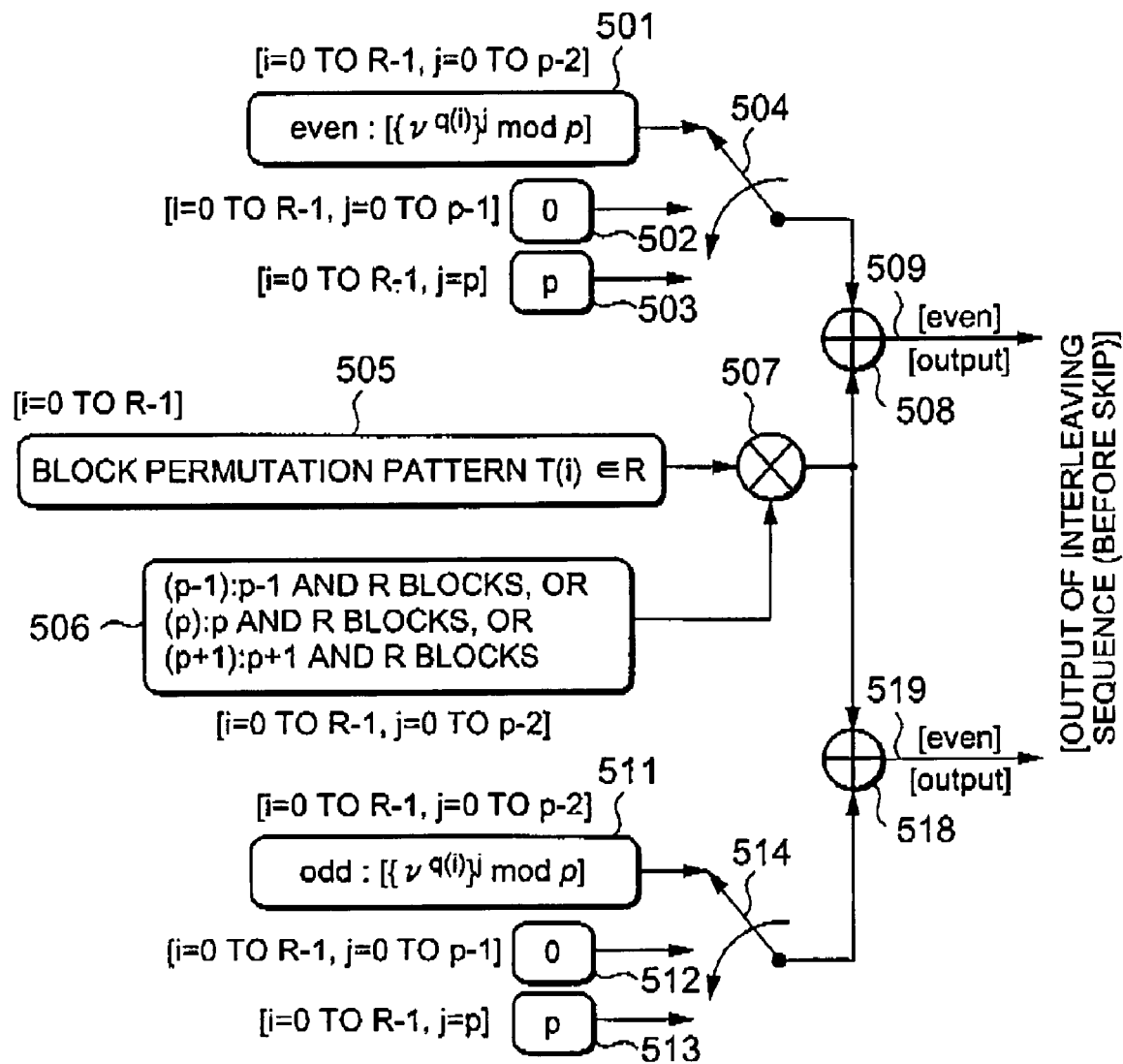
FIG. 5 is a block diagram for generating the interleaving sequence with the addition of row positions among blocks for continuously generating the interleaving sequence even in the case of skipping the signal.
Figure 6:
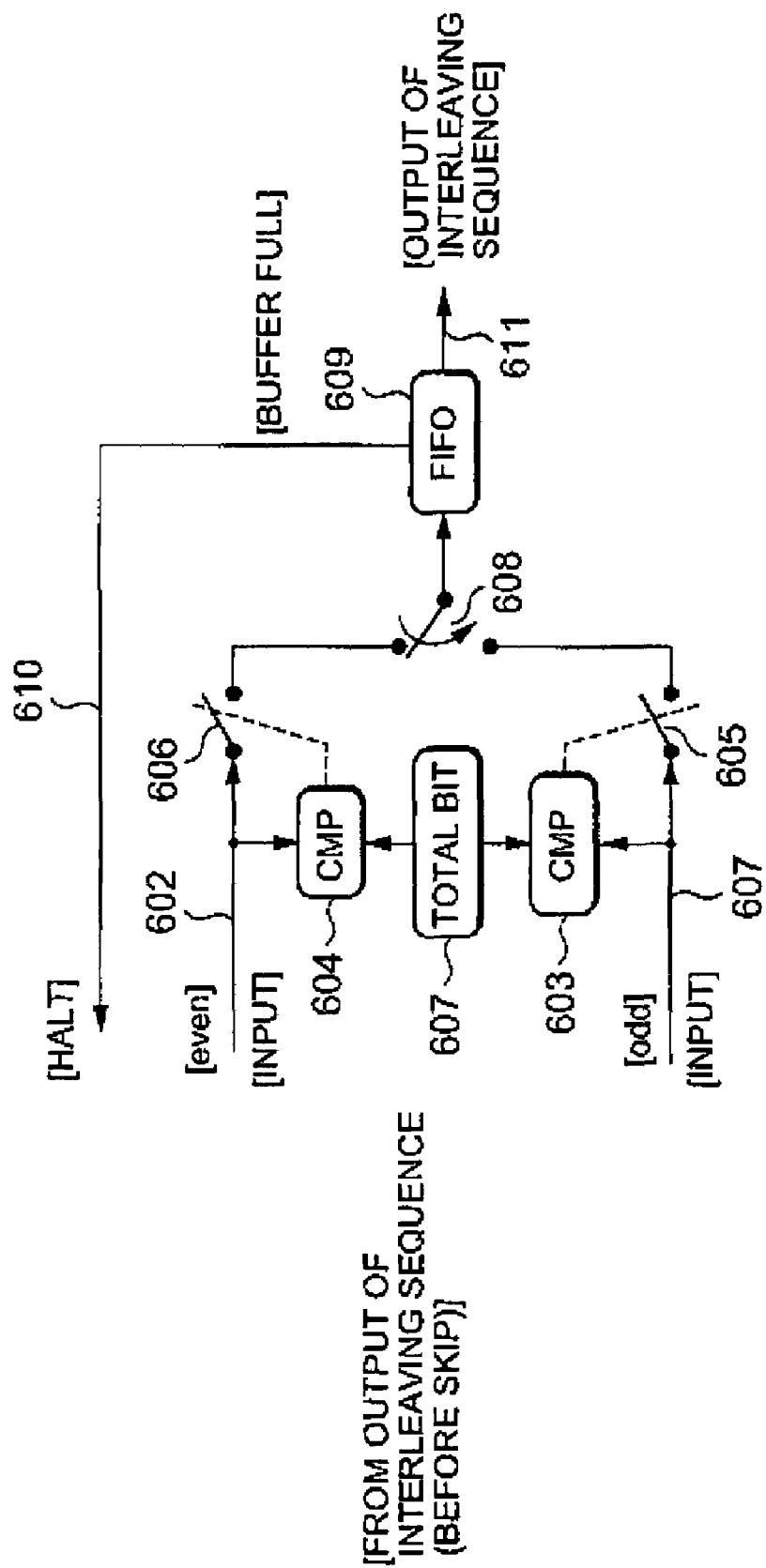
FIG. 6 is a block diagram for skipping the signal over an interleaver target range among signals indicating the interleaving sequence.

FIGS. 5 to 6 are block diagrams showing an interleaving sequence generator according to the second embodiment of the present invention.

According to the second embodiment, by providing the two split $(v\hat{\,}q_0)\hat{\,}j$ (mod p) to $(v\hat{\,}q_{R-1})\hat{\,}j$ (mod p) generating blocks shown in FIG. 4, the signal over the interleaver target range is skipped. In a block shown in FIG. 5, the addition processing (the number of columns corresponding to FIG. 2× block permutation pattern T(i)) is performed. In a block shown in FIG. 6, the signal over the interleaver target range is skipped.

Referring to FIG. 5, the $(v\hat{\,}q_0)\hat{\,}j$ (mod p) to $(v\hat{\,}q_{R-1})\hat{\,}j$ (mod p) generating block is split into a $(v\hat{\,}q_0)\hat{\,}j$, $(v\hat{\,}q_2)\hat{\,}j$, ..., (mod p) generating block 501 and a $(v\hat{\,}q_1)\hat{\,}j$, $(v\hat{\,}q_3)\hat{\,}j$, ..., (mod p) generating block 511. The basic operation thereof is similar to the operation of the $(v\hat{\,}q_0)\hat{\,}j$ (mod p) to $(v\hat{\,}q_{R-1})\hat{\,}j$ (mod p) generating block shown in FIG. 2 and a detailed description is omitted.

The column number setting portion 506 and the block permutation pattern T(i) generating portion 505 form a single portion because they are shared for both the even one and the odd one. The adder 508 outputs the interleaving sequence corresponding to the even number from an even output terminal 509 and an adder 518 outputs the interleaving sequence corresponding to the odd number from an odd output terminal 519.

In a block shown in FIG. 6, the signal over the interleaver target range is skipped among the signals indicating the interleaving sequences. Referring to FIG. 6, an interleaving sequence signal corresponding to the even number is inputted from a block 602. An interleaving sequence signal corresponding to the odd number is inputted from a block 601. These interleaving sequence signals are compared with a total number of bits 607 by comparators 604 and 605, and the interleaving sequence signal having bits more than the total number of bits 607 is skipped as the signal over the interleaver target range.

The above-generated interleaving sequence signals within the interleaver range are permuted to the original sequence by a switch 608, and are inputted to an FIFO 609. When the FIFO is full, the FIFO 609 outputs a buffer-full signal. Although not shown, the buffer-full signal becomes a halt signal 610 for each block and the operation of the blocks temporarily stops.

The final interleaving sequence output is read from the FIFO 609 and the signal is output from a terminal 611. Then, the halt signal is reset and the operation of the blocks restarts. That is, the buffering function of the FIFO 609 enables the continuous signal-generation of the interleaving sequence output 611.

Figure 7:
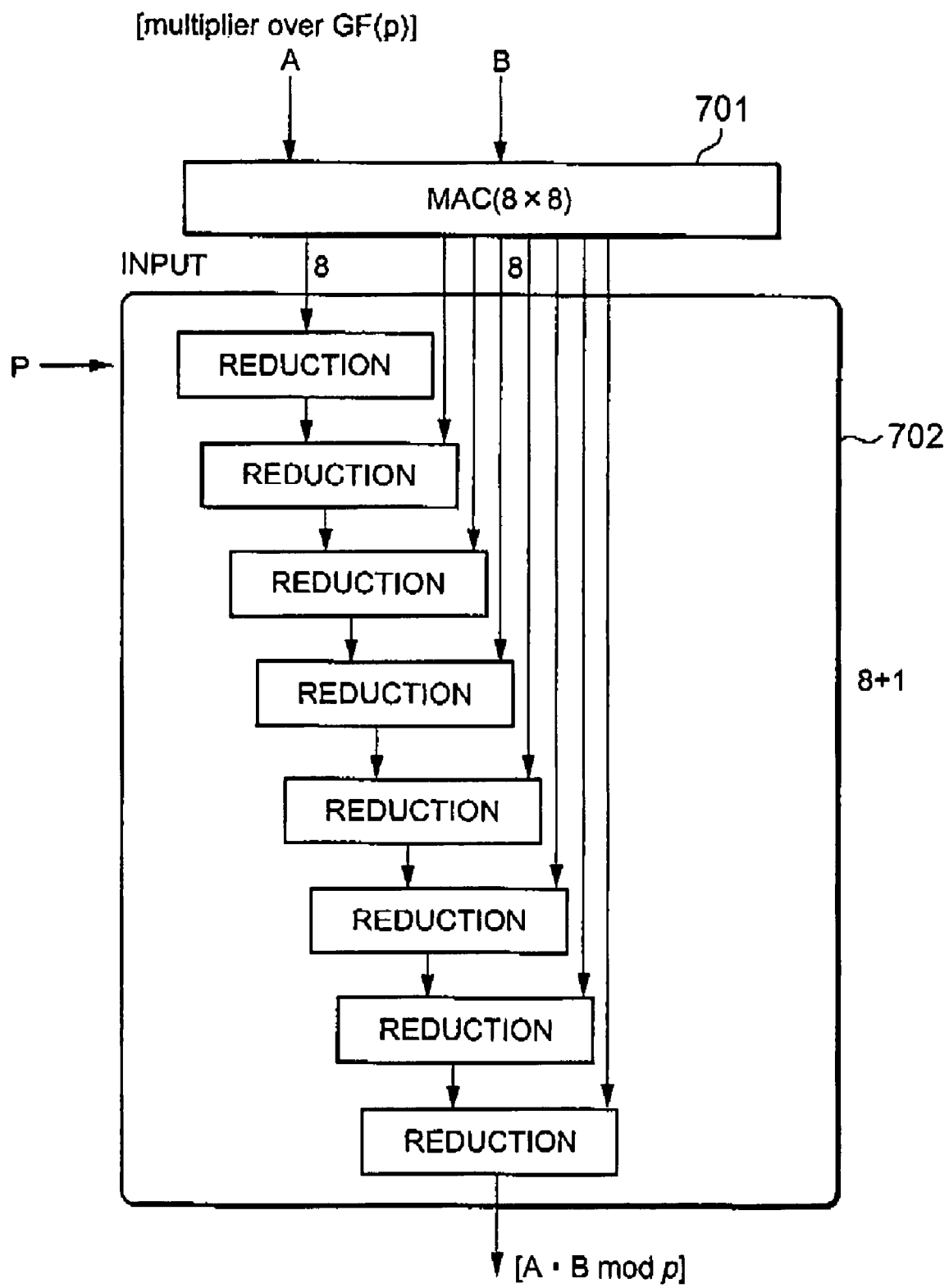
FIG. 7 is a diagram showing a fast multiplier on the finite field.
Figure 8:
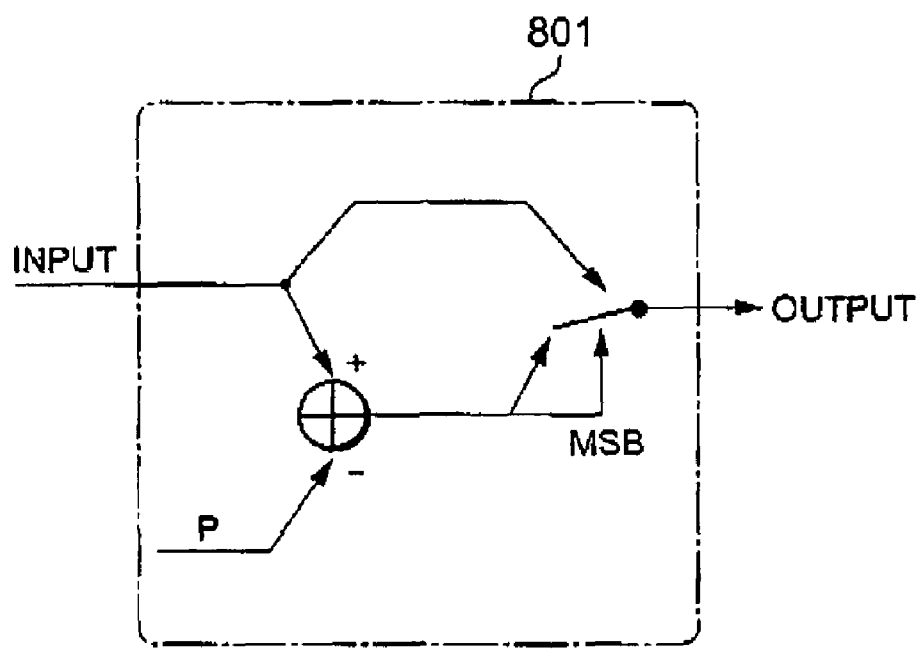
FIG. 8 is a diagram showing the component for modulo arithmetic.

FIG. 7 is a block diagram showing an example of the structure of the finite field multiplier 103 shown in FIG. 1 and the multipliers 403 and 413 on the finite field shown in FIG. 4. According to the second embodiment, the multiplier on the finite field comprises two portions of multiplication 701 and modulo arithmetic 702. The modulo arithmetic 702 comprises a comparing and subtracting circuit 801 shown in FIG. 8 which executes calculation 901 shown in FIG. 9.

Figure 9:
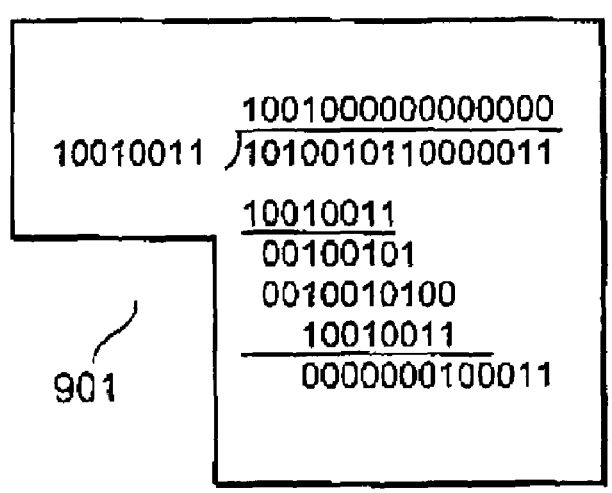
FIG. 9 is a diagram for explaining the operation of modulo arithmetic.

Referring to FIG. 9, in the calculation 901, when the calculation result of the multiplier 701 is 1010010110000011 as binary data, the modulo is obtained with p=10010011 as an example. First, the most significant 8 bits are used in the comparison and subtraction. This is realized with the structure of the comparing and subtracting circuit 801. The comparison result is determined by the most significant bits MSB and, if it is p or more, the subtracted value is output. The similar processing is performed by shifting 1 bit and finally the modulo arithmetic result is obtained.

The interleaving sequence generator is described above according to the second embodiment. Next, a description is given of the processing for actually permuting the data sequence by using the interleaving sequence generator.

Figure 10:
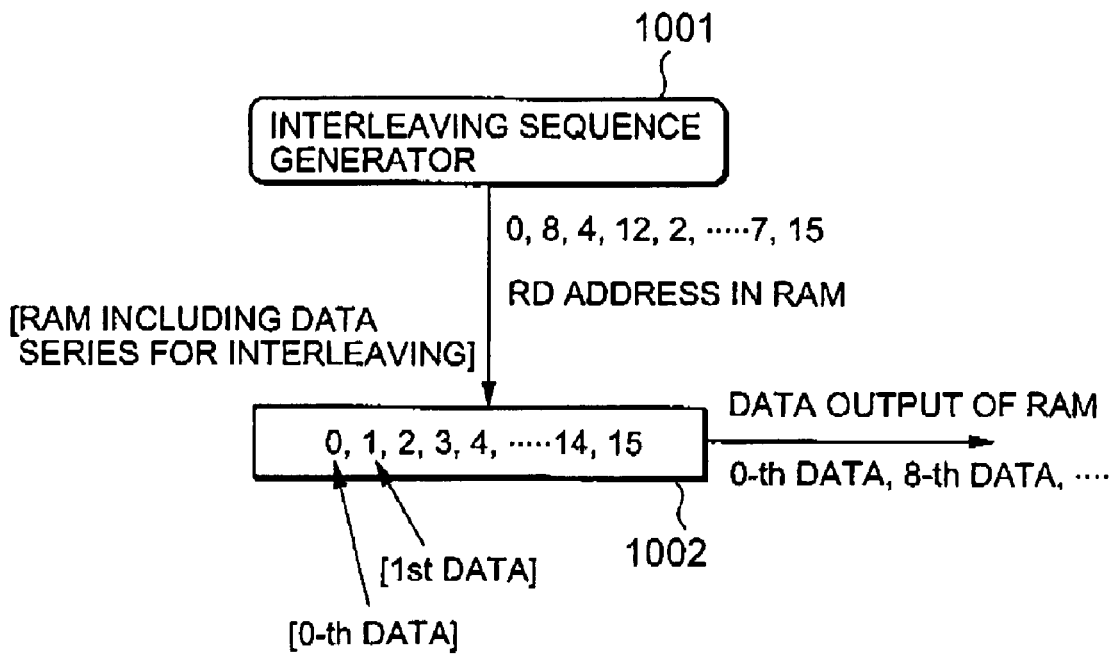
FIG. 10 is a diagram showing the interleaving processing using the reading operation.

FIG. 10 shows a method for the interleaving processing by permuting the sequence of data stored in a RAM. The interleaving processing is performed by reading the signal from an interleaving sequence generator 1001 as an address signal of a RAM 1002. For example, when the series of 0, 8, 4, 12, 2, ..., 7, and 15 is inputted to a read-address (RD Adr) in the RAM 1002 from the interleaving sequence generator, the 0-th data, the eighth data, ... of the data stored in the address order is output from the RAM 1002 and the data sequence is permuted.

Figure 11:
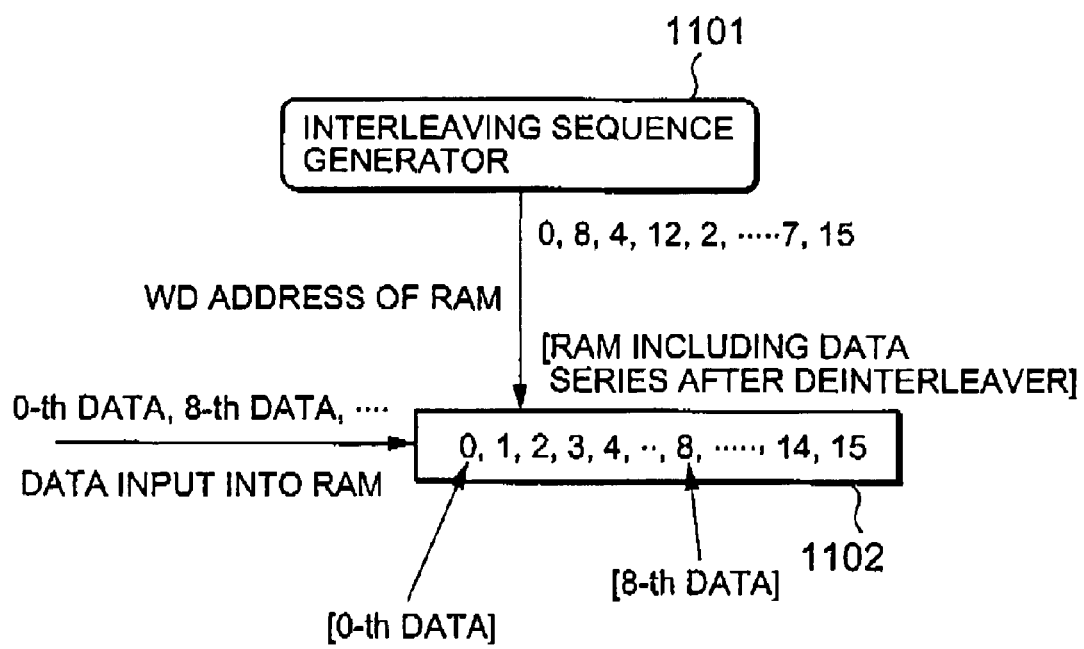
FIG. 11 is a diagram showing the deinterleaving processing using the writing operation.

FIG. 11 shows a method for the deinterleaving processing by the writing operation. Similarly to the interleaving using the reading operation shown in FIG. 10, the signal from the interleaving sequence generator 1101 is inputted as an address in a RAM 1102. Unlike that shown in FIG. 10, the address signal is a write-address and the data after the deinterleaving is stored in the RAM 1102.

For example, the above-mentioned interleaved data is inputted to the RAM 1102 in the order of the 0-th data, the eighth data, ... The same series of 0, 8, 4, 12, 2, ..., 7, and 15 as those shown in FIG. 10 are inputted to the write-address (WR Adr) in the RAM 1102 from the interleaving sequence generator 1101. Consequently, the data series are restored to the first sequence in the RAM 1102 and the addresses 0, 1, 2, ... are restored in the order of the 0-th data, the first data, the second data, ... and the deinterleaving is executed.

Both the deinterleaving and the interleaving can be exchangeable depending on the patterns. One is called the interleaving and then the other is called the deinterleaving. On the contrary, one is called the deinterleaving and then the other is called the interleaving. As mentioned above, both the interleaving and the deinterleaving can be realized by using the same interleaving sequence generator.

Figure 12:
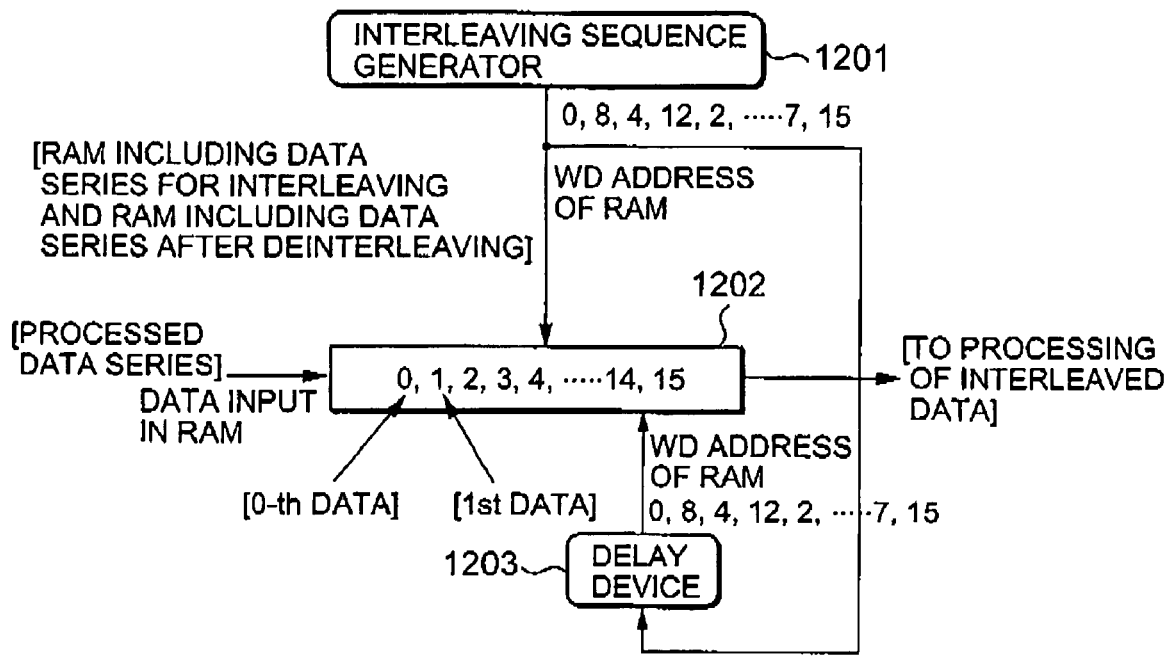
FIG. 12 is a diagram for simultaneously the interleaving processing using the reading operation from a dual-port RAM and the deinterleaving processing using the writing operation.

FIG. 12 is a diagram showing the simultaneous realization of the interleaving and deinterleaving with the above-mentioned relation by one interleaving sequence generator 1201. The interleaving and the deinterleaving are used upon permuting extrinsic information in a turbo decoder as will be described later and the a-prior information (a priori).

Referring to FIG. 12, a dual-port RAM 1202 stores a-priori data corresponding to a reception symbol in the address order. In the updating period for the interleaving, the series of 0, 8, 4, 12, 2, . . . , 7, and 15 are inputted from the interleaving sequence generator 1201 to a read-address in a RAM 1202 in accordance with the interleaving pattern. In accordance therewith, the 0-th data, the eighth data, . . . are output from the RAM 1202.

The interleaved data is processed by a turbo decoder, which will be described later. Thereafter, the processed data needs the deinterleaving for returning to the original order. Then, a delay element 1203 is inserted, the time is delayed by the processing time of the turbo decoder, and the deinterleaving processing is performed.

For example, it is assumed that the processed data is inputted to the RAM 1202 in the order of the 0-th data, the eighth data, . . . The write-address signals from the interleaving sequence generator 1201 via the delay element 1203 are 0, 8, 4, 12, 2 . . . , 7, and 15. In the RAM 1202, the addresses 0, 1, 2, . . . are restored in the order of the 0-th data, the first data, the second data, . . . and the deinterleaving is executed.

FIG. 13 is a block diagram showing a turbo encoder comprising an interleaving sequence generator 1301 and a dual-port RAM 1303 for the interleaving processing using the interleaving sequence generator 1301 according to the second embodiment of the present invention.

Figure 15:
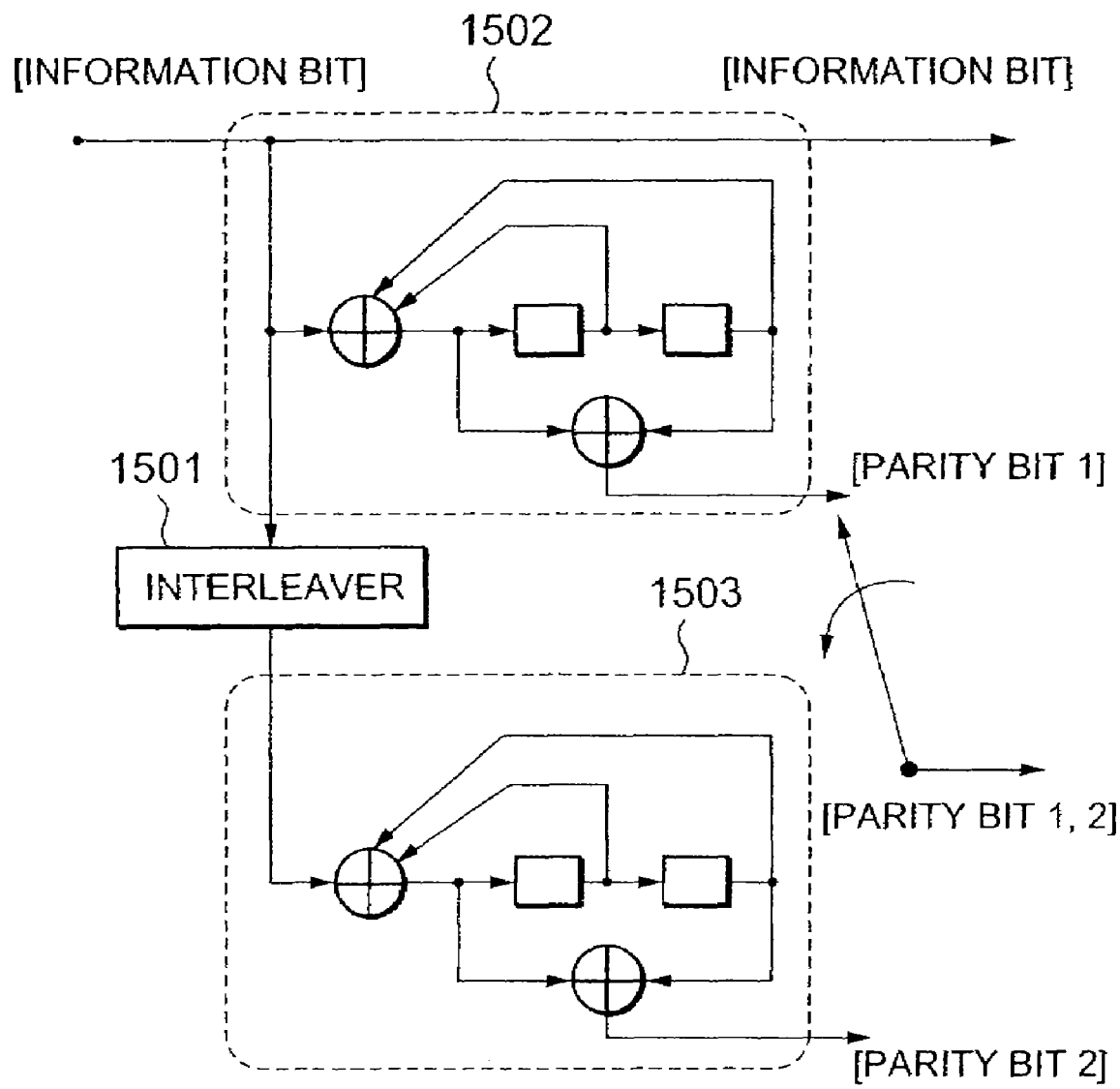
FIG. 15 is a diagram showing an example of the structure of a conventional turbo encoder.
Figure 16:
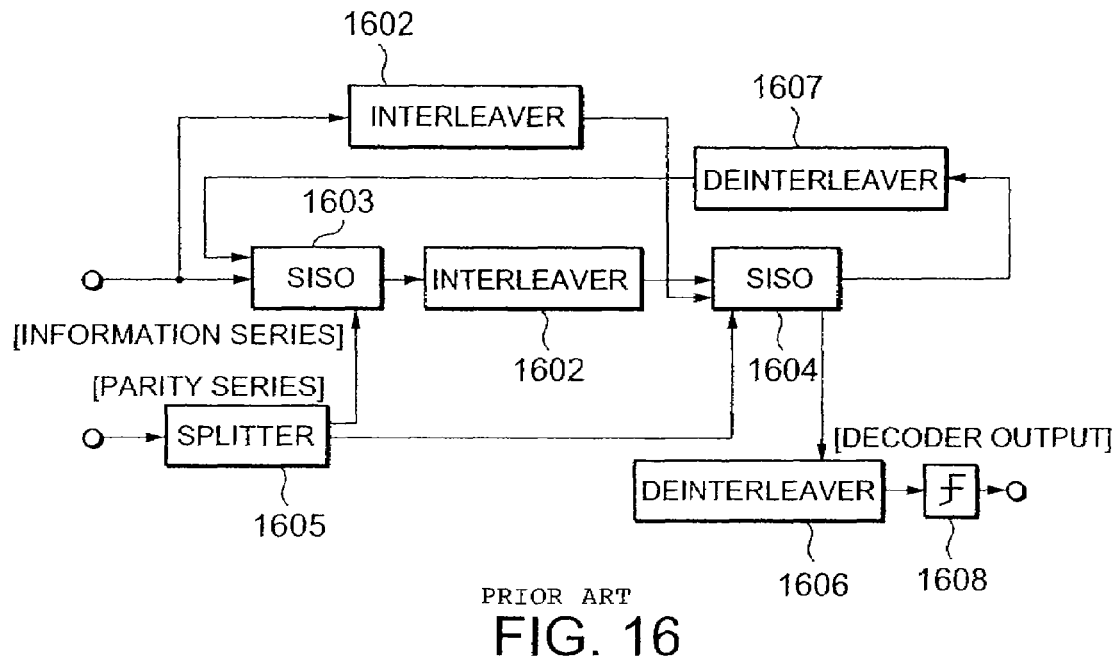
FIG. 16 is a diagram showing an example of the structure of a conventional turbo decoder.

Similarly to the conventional turbo encoder shown in FIG. 15, the turbo encoder according to the second embodiment comprises two component encoders 1304 and 1305. The component encoder 1304 receives the information sequence which is not subjected to the interleaving processing. The component encoder 1305 receives the information sequence which is subjected to the interleaving processing.

An output of an up counter 1302 is inputted as the address input RD Adr1 of the dual-port RAM 1303 and an output of the interleaving sequence generator 1301 is inputted as an address input RD Adr2 of the dual-port RAM 1303. Based on an address input RD Adr1 from the up counter 1302, the read information series in the dual-port RAM 1303 is inputted to the component encoder 1304. Based on the address input RD Adr2 from the interleaving sequence generator 1301, the read interleaved information series in the dual-port RAM 1303 is inputted to the component encoder 1305.

Figure 14:
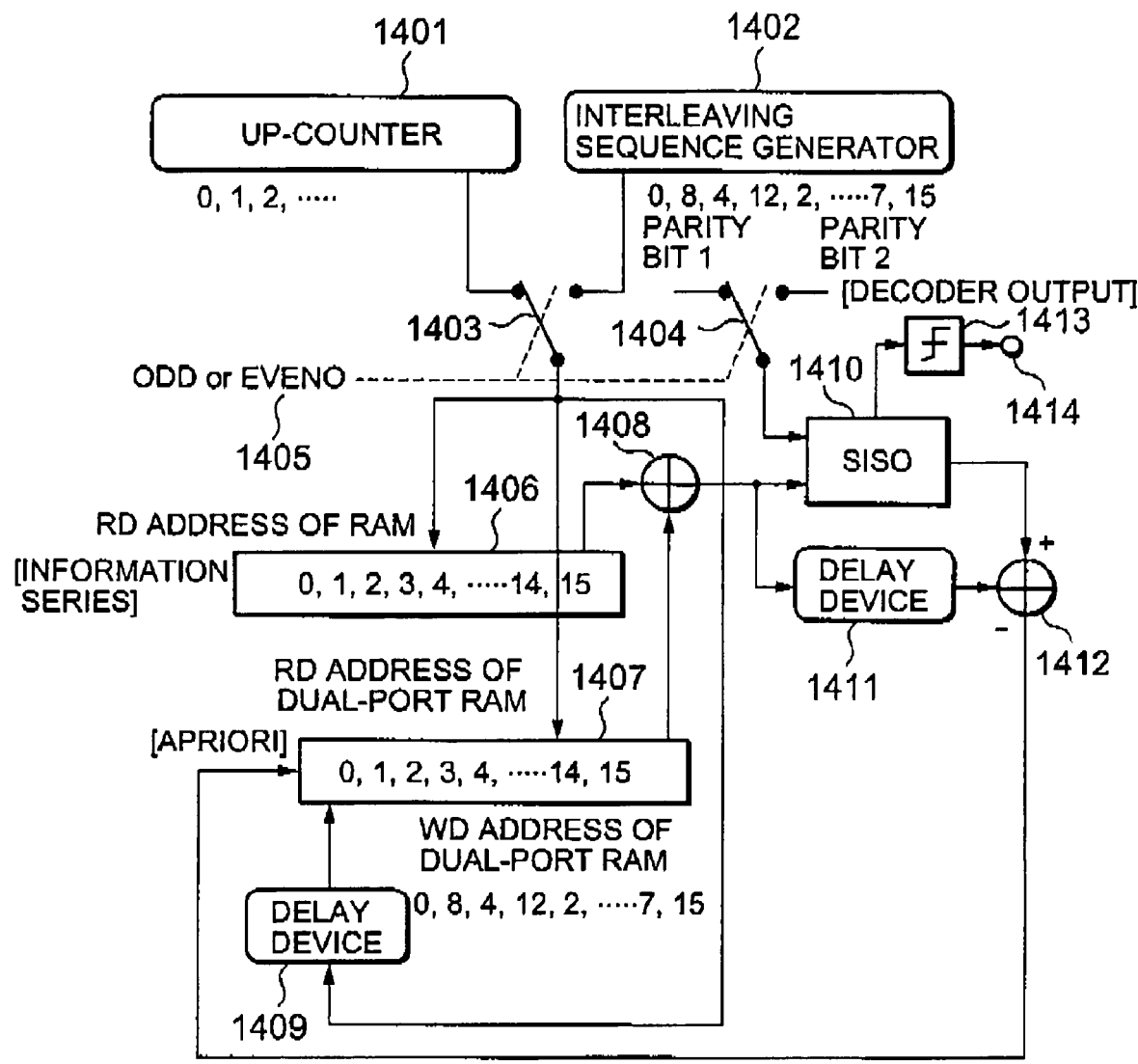
FIG. 14 is a diagram showing a turbo decoder using the interleaving sequence generator according to the present invention.

FIG. 14 is a block diagram showing a turbo decoder having an interleaving sequence generator 1402 and dual-port RAMs 1407 and 1406 for the interleaving processing and the deinterleaving processing using the interleaving sequence generator 1402 according to the third embodiment of the present invention.

An up counter 1401 or an interleaving sequence generator 1402 is connected via a selecting switch 1403 to the read-address in the dual-port RAM 1406 which stores the information series. The iteration processing in the turbo decoding has decoding using a parity bit 1 corresponding to the non-interleaving processing and decoding using a parity bit 2 corresponding to the interleaving processing. The selecting switches 1403 and 1404 are switches for switching the decoding, and are controlled by a switching signal 1405 for half iteration at the odd times or even times.

In the non-interleaving processing, the selecting switch 1403 selects the up counter 1401 and the selecting switch 1404 selects the parity bit 1.

The up counter 1401 is connected to the read-address of the dual-port RAM 1406 which stores the information sequence and therefore the dual-port RAM 1406 outputs the non-interleaved information sequence. Simultaneously, the up counter 1401 is connected to the read-address in a dual-port RAM 1407 via the switch 1403 and therefore the dual-port RAM 1407 outputs the non-interleaved a-priori data.

The two signals are added by an adder 1408, and are inputted to a soft-in soft-out decoder (SISO) 1410. The SISO 1410 comprises a so-called LogMAP or Max-LogMAP which performs MAP decoding logarithmically. The addition processing of the adder 1408 corresponds to the multiplication in the probability calculation.

The MAP algorithm is executed by the calculation result of the adder 1408 and the parity bit 1 selected by the switch 1404 and, based on the result, the addition value at the same timing of a register 1411 is subtracted by the adder 1412 and is inputted to the dual-port RAM 1407 as the next apriori data. The same read-address is inputted to the write-address of the dual-port RAM 1407 via a register 1409 at the same timing and therefore the apriori data is stored at the address corresponding to the symbol position of the information series.

Next, in the interleaving processing for half iteration, the selecting switch 1403 selects the interleaving sequence generator 1402, and the selecting switch 1404 selects the parity bit 2.

The interleaving sequence generator 1402 is connected to the read-address of the dual-port RAM 1406 which stores the information series and therefore the dual-port RAM 1406 outputs the interleaved information series. Simultaneously, the interleaving sequence generator 1402 is connected to the read-address of the dual-port RAM 1407 via the switch 1403 and, therefore, the dual-port RAM 1407 outputs the interleaved apriori data.

The adder 1408 adds the two signals and the resultant data is inputted to the soft-in soft-out decoder (SISO) 1410. The addition processing of the adder 1408 corresponds to the multiplying operation in the possibility calculation.

The MAP algorithm is executed by the calculation result of the adder 1408 and the parity bit 2 selected by the switch 1404 and, based on the result, the addition value at the same timing of the register 1411 is subtracted by the adder 1412 and is inputted to the dual-port RAM 1407 as the next apriori data. At the write-address of the dual-port RAM 1407, the same read-address is inputted at the same timing via the register 1409 and therefore the apriori data is stored at the original address position. That is, the data is subjected to the deinterleaving processing.

According to the feature of the turbo encoder, the iteration processing greatly improves the decoding performance. Finally, a detector 1413 implements the hard decision and, from an output terminal 1414, the decoding data is output.

The invention claimed is:

1. An interleaving sequence generator comprising:
 means which sets R blocks with a data length p based on a prime p and generates R different integers $q_0$, $q_1$ $q_2$, . . . , $q_{R-1}$ relatively prime to (p−1);
 means which calculates the element on the finite field when a characteristic is the prime p by raising a primitive root v to the powers of $q_0$, $q_1$ $q_2$, . . . , $q_{R-1}$, thus to generate and store values $v\char`\^q_0 \pmod p$, $v\char`\^q_1 \pmod p$, $v\char`\^q_2 \pmod p$, . . . , $v\char`\^q_{R-1} \pmod p$;
 means which raises the values $v\char`\^q_0$, $v\char`\^q_1$, $v\char`\^q_2$, . . . , $v\char`\^q_{R-1} \pmod p$ to the power of j on the finite field, thus to generate values $(v\hat{}q_0)\hat{}j(\bmod p)$, $(v\hat{}q_1)\hat{}j(\bmod p)$, $(v\hat{}q_2)\hat{}j(\bmod p)$, ..., $(v\hat{}q_{R-1})\hat{}j(\bmod p)$;

means which generates or records a block permutation pattern that is predetermined for permuting the blocks; and means iterates, when j=1 to (p−2), such an operation that one is sequentially added to a value obtained by multiplying, by p, an output from said means for generating or recording the block permutation pattern in the 0-th permutation and such an operation that said generated values $(v\hat{}q_0)\hat{}j$, $(v\hat{}q_1)\hat{}j$, $(v\hat{}q_2)\hat{}j$, ..., $(v\hat{}q_{R-1})\hat{}j(\bmod p)$ are sequentially added to a value obtained by multiplying, by p, an output from said means for generating or recording the block permutation pattern in the j-th permutation.

2. The interleaving sequence generator according to claim 1, further comprising:

means which sequentially updates said values $(v\hat{}q_0)\hat{}j$, $(v\hat{}q_1)\hat{}j$, $(v\hat{}q_2)\hat{}j$, ..., $(v\hat{}q_{R-1})\hat{}j(\bmod p)$ by sequentially inputting said generated and stored values $v\hat{}q_0$, $v\hat{}q_1, v\hat{}_2, ..., v\hat{}q_{R-1}(\bmod p)$ to a fast multiplier on the finite field in the iteration when j=1 to (p−2).

3. The interleaving sequence generator according to claim 2, further comprising means which sets, to zero, the entire values $(v\hat{}q_0)\hat{}j$, $(v\hat{}q_1)\hat{}j$, $(v\hat{}q_2)\hat{}j$, ..., $(v\hat{}q_{R-1})\hat{}j(\bmod p)$ when j=p−1.

4. The interleaving sequence generator according to claim 1, further comprising means which sets, to zero, the entire values $(v\hat{}q_0)\hat{}j$, $(v\hat{}q_1)\hat{}j$, $(v\hat{}q_2)\hat{}j$, ..., $(v\hat{}q_{R-1})\hat{}j(\bmod p)$ when j=p−1.

5. The interleaving sequence generator according to claim 1, further comprising:

means which skips an output signal from said interleaving sequence generator and uses a next signal within an interleaver target range when said output signal is over said range.

6. The interleaving sequence generator according to claim 1, further comprising:

means having a plurality of said multipliers on the finite field, which simultaneously updates a plurality of the values $(v\hat{}q_0)\hat{}j$, $(v\hat{}q_1)\hat{}j$, $(v\hat{}q_2)\hat{}j$, ..., $(v\hat{}q_{R-1})\hat{}j(\bmod p)$ by sharing with said plurality of fast multipliers on the finite field upon updating the values $(v\hat{}q_0)\hat{}j$, $(v\hat{}q_1)\hat{}j$, $(v\hat{}q_2)\hat{}j$, ..., $(v\hat{}q_{R-1})\hat{}j(\bmod p)$.

7. The interleaving sequence generator according to claim 6, further comprising:

means having two said fast multiplier on the finite field, which assigns said two fast multipliers to values $v\hat{}q_0$, $v\hat{}q_2, v\hat{}q_4, ...,(\bmod p)$ as an even multiple and values $v\hat{}q_1, v\hat{}q_3, v\hat{}q_5, ...,(\bmod p)$ as an odd multiple that are obtained by splitting said generated and stored values $v\hat{}q_0, v\hat{}q_1, v\hat{}q_2, ..., v\hat{}q_{R-1}(\bmod p)$ and which simultaneously updates in parallel the values $(v\hat{}q_0)\hat{}j$, $(v\hat{}q_2)\hat{}j, ...,(\bmod p)$ and $(v\hat{}q_1)\hat{}j, (v\hat{}q_3)\hat{}j, ...,(\bmod p)$ by the j-th power on the finite field.

8. An interleaver comprising means which sets, to an address signal of a memory for storing data, an output of said interleaving sequence generating circuit according to claim 1 and reads the data from said memory by said address signal, thus to permute the data.

9. A turbo encoder, wherein said interleaver according to claim 8 is an internal interleaver in said turbo encoder.

10. An interleaver, wherein an output of said interleaving sequence generating circuit according to claim 1 is set to an address signal of a memory for storing data, and the data is written to said memory by said address signal, thus to permute the data.

11. A turbo decoder comprising:

a first interleaver which sets, to an address signal of a memory for storing data, an output of said interleaving sequence generating circuit according to claim 1, and permutes the data by reading the data from said memory by said address signal; and a second interleaver which sets, to an address signal of a memory for storing data, an output of said interleaving sequence generating circuit according to claim 1, and permutes the data by writing the data to said memory by said address signal, wherein one of said first and second interleavers is an internal interleaver, and the other is an internal deinterleaver.

12. A turbo decoder, wherein an output of said interleaving sequence generator according to claim 1 is set to a read-address signal of a dual-port memory for storing data and the data contents are read, the address signal is delayed by a predetermined value and is set to a write-address signal, and the data contents are written, thus to simultaneously realize an internal interleaver and an internal deinterleaver in said turbo decoder.

13. An interleaving sequence generator comprising:

means which sets R blocks with a data length (p−1) based on a prime p and generates R different integers $q_0$, $q_1$, $q_2$, ..., $q_{R-1}$ relatively prime to (p−1);

means which calculates the element on the finite field when a characteristic is the prime p by raising a primitive root v to the powers of $q_0, q_1, q_2, ..., q_{R-1}$, thus to generate and store values $v\hat{}q_0(\bmod p)$, $v\hat{}q_1(\bmod p)$, $v\hat{}q_2(\bmod p)$, ..., $v\hat{}q_{R-1}(\bmod p)$;

means which raises the values $v\hat{}q_0, v\hat{}q_1, v\hat{}q_2, ..., v\hat{}q_{R-1}(\bmod p)$ to the power of j on the finite field, thus to generate values $(v\hat{}q_0)\hat{}j(\bmod p)$, $(v\hat{}q_1)\hat{}j(\bmod p)$, $(v\hat{}q_2)\hat{}j(\bmod p)$, ..., $(v\hat{}q_{R-1})\hat{}j(\bmod p)$;

means which generates or records a block permutation pattern that is predetermined for permuting the blocks; and means iterates, when j=1 to (p−2), such an operation that one is sequentially added to a value obtained by multiplying, by p−1, an output from said means for generating or recording the block permutation pattern in the 0-th permutation and such an operation that said generated values $(v\hat{}q_0)\hat{}j$, $(v\hat{}q_1)\hat{}j$, $(v\hat{}q_2)\hat{}j$, ..., $(v\hat{}q_{R-1})\hat{}j(\bmod p)$ are sequentially added to a value obtained by multiplying, by p−1, an output from said means for generating or recording said block permutation pattern in the j-th permutation.

14. The interleaving sequence generator according to claim 13, further comprising:

means which subtracts 1 from the value that is obtained by sequential addition.

15. The interleaving sequence generator according to claim 13, further comprising:

means which sequentially updates the generated and stored values $(v\hat{}q_0)\hat{}j$, $(v\hat{}q_1)\hat{}j$, $(v\hat{}q_2)\hat{}j$, ..., $(v\hat{}q_{R-1})\hat{}j(\bmod p)$ by sequentially inputting, to a fast multiplier on the finite field, the values $(v\hat{}q_0)\hat{}j$, $(v\hat{}q_1)\hat{}j, (v\hat{}q_2)\hat{}j, ..., (v\hat{}q_{R-1})\hat{}j(\bmod p)$ in the iteration when j=1 to (p−2).

16. The interleaving sequence generator according to claim 13, further comprising:

means which skips an output signal of said interleaving sequence generator that is over an interleaver target range and uses a next signal within said range when the output signal is over said range.

17. The interleaving sequence generator according to claim 13, further comprising:
means having a plurality of fast multipliers on the finite field, which simultaneously updates a plurality of the values $(v\hat{\,}q_0)\hat{\,}j$, $(v\hat{\,}q_1)\hat{\,}j$, $(v\hat{\,}q_2)\hat{\,}j$, ..., $(v\hat{\,}q_{R-1})\hat{\,}j(\mod p)$ by sharing with said plurality of fast multipliers on the finite field upon updating the values $(v\hat{\,}q_0)\hat{\,}j$, $(v\hat{\,}q_1)\hat{\,}j$, $(v\hat{\,}q_2)\hat{\,}j$, ..., $(v\hat{\,}q_{R-1})\hat{\,}j(\mod p)$.

18. The interleaving sequence generator according to claim 17, further comprising:
means having two fast multipliers on the finite field, which assigns said two fast multipliers to values $v\hat{\,}q_0$, $v\hat{\,}q_2$, $v\hat{\,}q_4$, ..., $(\mod p)$ as an even multiple and values $v\hat{\,}q_1$, $v\hat{\,}q_3$, $v\hat{\,}q_5$, ..., $(\mod p)$ as an odd multiple that are obtained by splitting said generated and stored values $v\hat{\,}q_0$, $v\hat{\,}q_1$, $v\hat{\,}q_2$, ..., $v\hat{\,}q_{R-1}(\mod p)$, and simultaneously updates in parallel the values $(v\hat{\,}q_0)\hat{\,}j$, $(v\hat{\,}q_2)\hat{\,}j$, ..., $(\mod p)$ and the values $(v\hat{\,}q_2)\hat{\,}j$, $(v\hat{\,}q_3)\hat{\,}j$, ..., $(\mod p)$ by raising the values to the power of j on the finite field.

19. An interleaver, further comprising:
means which sets, to an address signal of a memory for storing data, an output of said interleaving sequence generating circuit according to claim 13, and permutes the data by reading the data from said memory by said address signal.

20. A turbo encoder, wherein said interleaver according to claim 19 is an internal interleaver in said turbo encoder.

21. An interleaver, wherein an output of said interleaving sequence generating circuit according to claim 13 is set to an address signal of a memory for storing data and the data is written to said memory by said address signal, thus to sequentially permute the data.

22. A turbo decoder comprising:
a first interleaver which sets, to an address signal of a memory for storing data, an output of said interleaving sequence generating circuit according to claim 13, and permuting the data by reading the data from said memory by said address signal; and
a second interleaver which sets, to an address signal of a memory for storing data, an output of said interleaving sequence generating circuit according to claim 13, and permutes the data by writing the data to said memory by said address signal, wherein one of said first and second interleavers is an internal interleaver, and the other is an internal deinterleaver.

23. A turbo decoder, wherein an output of said interleaving sequence generator according to claim 13 as data contents is read as a read-address signal of a dual-port memory for storing data, said address signal is delayed by a predetermined value, and data contents of said address signal are written as a write-address signal, thus to simultaneously realize an internal interleaver and an internal deinterleaver in said turbo decoder.

24. An interleaving sequence generator comprising:
means which sets R blocks with a data length (p+1) based on a prime p and generates R integers $q_0$, $q_1$, $q_2$, ..., $q_{R-1}$ relatively prime to a value (p−1);
means which calculates elements on the finite field with the characteristic of prime p by raising a primitive root v to the powers of $q_0$, $q_1$, $q_2$, ..., $q_{R-1}$, thus to generate and store values $v\hat{\,}q_0$, $v\hat{\,}q_1$, $v\hat{\,}q_2$, ..., $v\hat{\,}q_{R-1}$ (mod p);
means which raises the values $v\hat{\,}q_0$, $v\hat{\,}q_1$, $v\hat{\,}q_2$, ..., $v\hat{\,}q_{R-1}$ (mod p) to the power of j on the finite field, thus to generate values $(v\hat{\,}q_0)\hat{\,}j$, $(v\hat{\,}q_1)\hat{\,}j$, $(v\hat{\,}q_2)\hat{\,}j$, ..., $(v\hat{\,}q_{R-1})\hat{\,}j$ (mod p);

means which generates or records a block permutation pattern that is predetermined for permuting the blocks;
means which iterates, when j=1 to (p−2), such an operation that one is sequentially added to a value obtained by multiplying, by p+1, an output from said means for generating or recording the block permutation pattern in the 0-th permutation and such an operation that said generated values $(v\hat{\,}q_0)\hat{\,}j$, $(v\hat{\,}q_1)\hat{\,}j$, $(v\hat{\,}q_2)\hat{\,}j$, ..., $(v\hat{\,}q_{R-1})\hat{\,}j(\mod p)$ are sequentially added to a value obtained by multiplying, by p, an output from said means for generating or recording said block permutation pattern in the j-th permutation.

25. The interleaving sequence generator according to claim 24, further comprising:
means which sequentially updates the values $(v\hat{\,}q_0)\hat{\,}j$, $(v\hat{\,}q_1)\hat{\,}j$, $(v\hat{\,}q_2)\hat{\,}j$, ..., $(v\hat{\,}q_{R-1})\hat{\,}j(\mod p)$ by sequentially inputting said generated and stored values $v\hat{\,}q_0$, $v\hat{\,}q_1$, $v\hat{\,}q_2$, ..., $v\hat{\,}q_{R-1}(\mod p)$ to a multiplier on the finite field in the iteration when j=1 to (p−2).

26. The interleaving sequence generator according to claim 24, further comprising:
means which sets, to 0, the entire values $(v\hat{\,}q_0)\hat{\,}j$, $(v\hat{\,}q_1)\hat{\,}j$, $(v\hat{\,}q_2)\hat{\,}j$, ..., $(v\hat{\,}q_{R-1})\hat{\,}j(\mod p)$ when j=p−1.

27. The interleaving sequence generator according to claim 24, further comprising:
means which sets, to p, the entire values $(v\hat{\,}q_0)\hat{\,}j$, $(v\hat{\,}q_1)\hat{\,}j$, $(v\hat{\,}q_2)\hat{\,}j$, ..., $(v\hat{\,}q_{R-1})\hat{\,}j(\mod p)$ when j=p.

28. The interleaving sequence generator according to claim 24, further comprising:
means which skips an output signal of said interleaving sequence generator when it is over an interleaver target range and uses a next signal within said range.

29. The interleaving sequence generator according to claim 24, further comprising:
means having a plurality of fast multipliers on the finite field, which simultaneously updates a plurality of values $(v\hat{\,}q_0)\hat{\,}j$, $(v\hat{\,}q_1)\hat{\,}j$, $(v\hat{\,}q_2)\hat{\,}j$, ..., $(v\hat{\,}q_{R-1})\hat{\,}j(\mod p)$ by sharing with said plurality of fast multipliers on the finite field upon updating of the values $(v\hat{\,}q_0)\hat{\,}j$, $(v\hat{\,}q_1)\hat{\,}j$, $(v\hat{\,}q_2)\hat{\,}j$, ..., $(v\hat{\,}q_{R-1})\hat{\,}j(\mod p)$.

30. The interleaving sequence generator according to claim 29, further comprising:
means having two fast multipliers on the finite field, which assigns said two fast multipliers to values $v\hat{\,}q_0$, $v\hat{\,}q_2$, $v\hat{\,}q_4$, ..., $(\mod p)$ as an even number and values $v\hat{\,}q_1$, $v\hat{\,}q_3$, $v\hat{\,}q_5$, ..., $(\mod p)$ as an odd number that are obtained by splitting the generated and stored values $v\hat{\,}q_0$, $v\hat{\,}q_1$, $v\hat{\,}q_2$, ..., $v\hat{\,}q_{R-1}$ (mod p), and simultaneously updates in parallel the values $(v\hat{\,}q_0)\hat{\,}j$, $(v\hat{\,}q_2)\hat{\,}j$, ..., (mod p) and $(v\hat{\,}q_1)\hat{\,}j$, $(v\hat{\,}q_3)\hat{\,}j$, ..., (mod p) by the j-th power on the finite field.

31. An interleaver comprising:
means which sets an output of said interleaving sequence generating circuit according to claim 24 to an address signal of a memory for storing data and reads the data from said memory by said address signal, thus to permute the data sequence.

32. A turbo encoder, wherein said interleaver according to claim 31 is an internal interleaver in said turbo encoder.

33. An interleaver, wherein an output of said interleaving sequence generating circuit according to claim 24 is set to an address signal of a memory for storing data and the data is written to said memory by said address signal, thus to sequentially permute the data.

34. A turbo decoder comprising:
a first interleaver having means which sets, to an address signal of a memory for storing data, an output of said interleaving sequence generating circuit according to claim 24 and reads the data from said memory by said address signal, thus to permute the data; and a second interleaver which sets, to an address signal of a memory for storing data, an output of said interleaving sequence generating circuit according to claim 24 and writes the data to said memory by said address signal, thus to permute the data, wherein one of said first and second interleavers is set to an internal interleaver and the other is set to an internal deinterleaver.

35. A turbo decoder, wherein an output of an interleaving sequence generator according to claim 24 containing data contents is read as an address signal for reading a dual-port memory for storing data, and the address signal subjected to the delay operation with a predetermined value containing the data contents is written as an address signal for writing, thus simultaneously realizing an internal interleaver and an internal deinterleavers in said turbo decoder.

36. A circuit for an interleaving sequence generator, the circuit comprising:

a first memory comprising R registers that stores and provides a sequence of values, wherein the sequence comprises a primitive root v raised to a power of an integer q modulo p, wherein p is a prime and each integer q is a sequence of different integers $q_0$, $q_1$, $q_2$, . . . , $q_{R-1}$, and each integer is relatively prime to (p−1);

a second memory comprising R registers that sequentially provides a row value stored in the registers; and a fast multiplier that prompts both the first and second memories for values, calculates a product modulo p of the values to create a new row permutation value, and stores the new row permutation value in the second memory, iteratively R times.

37. The circuit of claim 36, further comprising:

a third memory comprising R registers that sequentially provides a column permutation sequence value;

an arithmetic logic circuit that iteratively p−1 times:

calculates a product from a column value from the third memory times p;

iteratively R times outputs a sequence value calculated from the sum of the product and a row permutation value from the second memory; and prompts the fast multiplier to calculate new row permutation values.

* * * * *